(12) United States Patent
Higuchi et al.

(10) Patent No.: US 8,903,523 B2
(45) Date of Patent: Dec. 2, 2014

(54) AUDIO PROCESSING DEVICE, AUDIO PROCESSING METHOD, AND PROGRAM

(75) Inventors: Satoshi Higuchi, Kanagawa (JP);
Keisuke Satou, Kanagawa (JP);
Takayuki Niitsuma, Kanagawa (JP)

(73) Assignee: Sony Corporation (JP)

( * ) Notice: Subject to any disclaimer, the term of this patent is extended or adjusted under 35 U.S.C. 154(b) by 1507 days.

(21) Appl. No.: 12/386,234

(22) Filed: Apr. 15, 2009

(65) Prior Publication Data

US 2009/0281643 A1 Nov. 12, 2009

(30) Foreign Application Priority Data

Apr. 17, 2008 (JP) ................................ P2008-107498

(51) Int. Cl.
| | |
|---|---|
| G06F 17/00 | (2006.01) |
| H04N 21/439 | (2011.01) |
| H04N 21/84 | (2011.01) |
| H04N 5/60 | (2006.01) |
| H04N 21/4363 | (2011.01) |
| H04N 21/434 | (2011.01) |
| H04N 5/44 | (2011.01) |
| H04N 21/41 | (2011.01) |
| H03G 3/34 | (2006.01) |

(52) U.S. Cl.
CPC ........... *H04N 5/602* (2013.01); *H04N 21/4396* (2013.01); *H04N 21/84* (2013.01); *H04N 5/607* (2013.01); *H03G 3/342* (2013.01); *H04N 21/43635* (2013.01); *H04N 21/4341* (2013.01); *H04N 21/4345* (2013.01); *H04N 5/44* (2013.01); *H04N 21/4135* (2013.01)
USPC ........................................................ 700/94

(58) Field of Classification Search
USPC ........................................................ 700/94
See application file for complete search history.

(56) References Cited

FOREIGN PATENT DOCUMENTS

| | | |
|---|---|---|
| JP | 2006-113998 A | 4/2006 |
| JP | 2008-035399 A | 2/2008 |
| JP | 2008-078879 A | 4/2008 |
| JP | 2008-084366 A | 4/2008 |
| JP | 2008-092208 A | 4/2008 |
| WO | 2007-072821 A1 | 6/2007 |

OTHER PUBLICATIONS

JP 2008-078879A (Apr. 3, 2008) (Machine Translation).*
High-Definition Multimedia Interface Specification, Version 1.3a, Nov. 10, 2006, pp. ii-156 and Supplement 1 Consumer Electronics Control (CEC), pp. ii-97.
European Search Report, EP 09 156754, dated Jul. 7, 2009.
Office Action from Chinese Application No. 200910134521.5, dated Nov. 26, 2010.

* cited by examiner

*Primary Examiner* — Andrew C Flanders
(74) *Attorney, Agent, or Firm* — Lerner, David, Littenberg, Krumholz & Mentlik, LLP

(57) ABSTRACT

An audio processing device includes an audio input selecting unit configured to select a predetermined audio input from among a plurality of audio inputs; a signal processing unit configured to give a predetermined sound field characteristic to audio signals of the audio input selected by the audio input selecting unit; a signal output unit configured to output the audio signals obtained in the signal processing unit; a genre information receiving unit configured to receive genre information transmitted from any of audio signal output devices; and a sound field control unit configured to control the signal processing unit to give a sound field characteristic corresponding to the genre information if the genre information received by the genre information receiving unit is determined to be the genre information corresponding to the audio input selected by the audio input selecting unit.

20 Claims, 32 Drawing Sheets

FIG. 2

| ADDRESS | DEVICE |
| --- | --- |
| 0 | TV |
| 1 | RECORDING DEVICE 1 |
| 2 | RECORDING DEVICE 2 |
| 3 | TUNER 1 |
| 4 | PLAYBACK DEVICE 1 |
| 5 | AUDIO SYSTEM |
| 6 | TUNER 2 |
| 7 | TUNER 3 |
| 8 | PLAYBACK DEVICE 2 |
| 9 | RECORDING DEVICE 3 |
| 10 | TUNER 4 |
| 11 | PLAYBACK DEVICE 3 |
| 12 | RESERVED |
| 13 | RESERVED |
| 14 | FREE USE |
| 15 | UNREGISTERED (AS INITIATOR ADDRESS) BROADCAST (AS DESTINATION ADDRESS) |

FIG. 3

| GENRE INFORMATION | SOUND FIELD |
|---|---|
| NEWS/MEDIA | NEWS |
| SPORTS | SPORTS |
| INFORMATION/TABLOID TV SHOW | STANDARD |
| DRAMA | STANDARD |
| MUSIC | MUSIC |
| VARIETY | STANDARD |
| MOVIE | MOVIE |
| ANIMATION/SPECIAL EFFECTS | STANDARD |
| DOCUMENTARY | STANDARD |
| THEATER/PERFORMANCE | MUSIC |
| HOBBY/EDUCATION | NEWS |
| WELFARE | NEWS |
| OTHERS | STANDARD |
| SPORTS (CS) | SPORTS |
| FOREIGN MOVIE (CS) | MOVIE |
| DOMESTIC MOVIE (CS) | MOVIE |
| NO INFORMATION (*) | STANDARD OR HOLD PREVIOUS S.F. VALUE |

FIG. 4

| SOUND FIELD | FEATURE |
|---|---|
| STANDARD | NO PARTICULAR AUDIO PROCESS |
| MOVIE | EFFECT SUITABLE FOR WATCHING MOVIE |
| NEWS | INCREASE ARTICULATION OF ANNOUNCEMENT BY APPROPRIATE EQ IN ALL CHANNELS |
| SPORTS | INCREASE ARTICULATION OF ANNOUNCEMENT OF COMMENTS IN SPORTS PROGRAM BY COMPULSIVE SURROUND SOUND AND APPROPRIATE EQ IN CENTER CHANNEL |
| GAME | EFFECT SUITABLE FOR PLAYING HOME-USE GAME MACHINE |
| MUSIC | WIDE STEREO PROCESS IN 2 CH |
| JAZZ | MUSIC EFFECT (JAZZ) |
| CLASSIC | MUSIC EFFECT (CLASSIC) |
| ROCK | MUSIC EFFECT (ROCK) |
| POP | MUSIC EFFECT (POP) |
| DANCE | MUSIC EFFECT (DANCE) |
| FLAT | STEREO PROCESS IN 2 CH |

FIG. 11

| PIN | SIGNAL ASSIGNMENT |
|---|---|
| 1 | TMDS DATA2+ |
| 3 | TMDS DATA2− |
| 5 | TMDS DATA1 SHIELD |
| 7 | TMDS DATA0+ |
| 9 | TMDS DATA0− |
| 11 | TMDS CLOCK SHIELD |
| 13 | CEC |
| 15 | SCL |
| 17 | DDC/CEC GROUND |
| 19 | HOT PLUG DETECT |

| PIN | SIGNAL ASSIGNMENT |
|---|---|
| 2 | TMDS DATA2 SHIELD |
| 4 | TMDS DATA1+ |
| 6 | TMDS DATA1− |
| 8 | TMDS DATA0 SHIELD |
| 10 | TMDS CLOCK+ |
| 12 | TMDS CLOCK− |
| 14 | RESERVED (N.C. ON DEVICE) |
| 16 | SDA |
| 18 | +5V POWER |

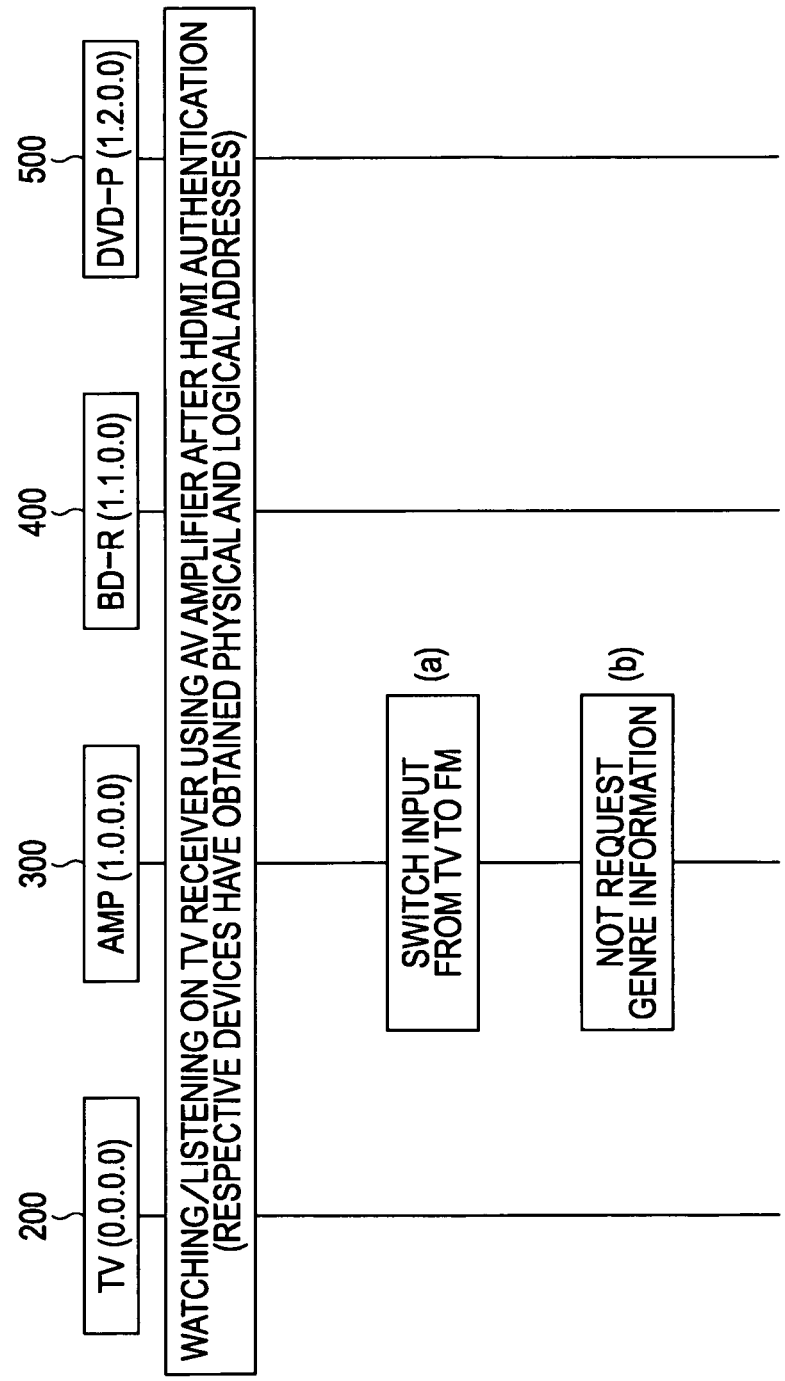

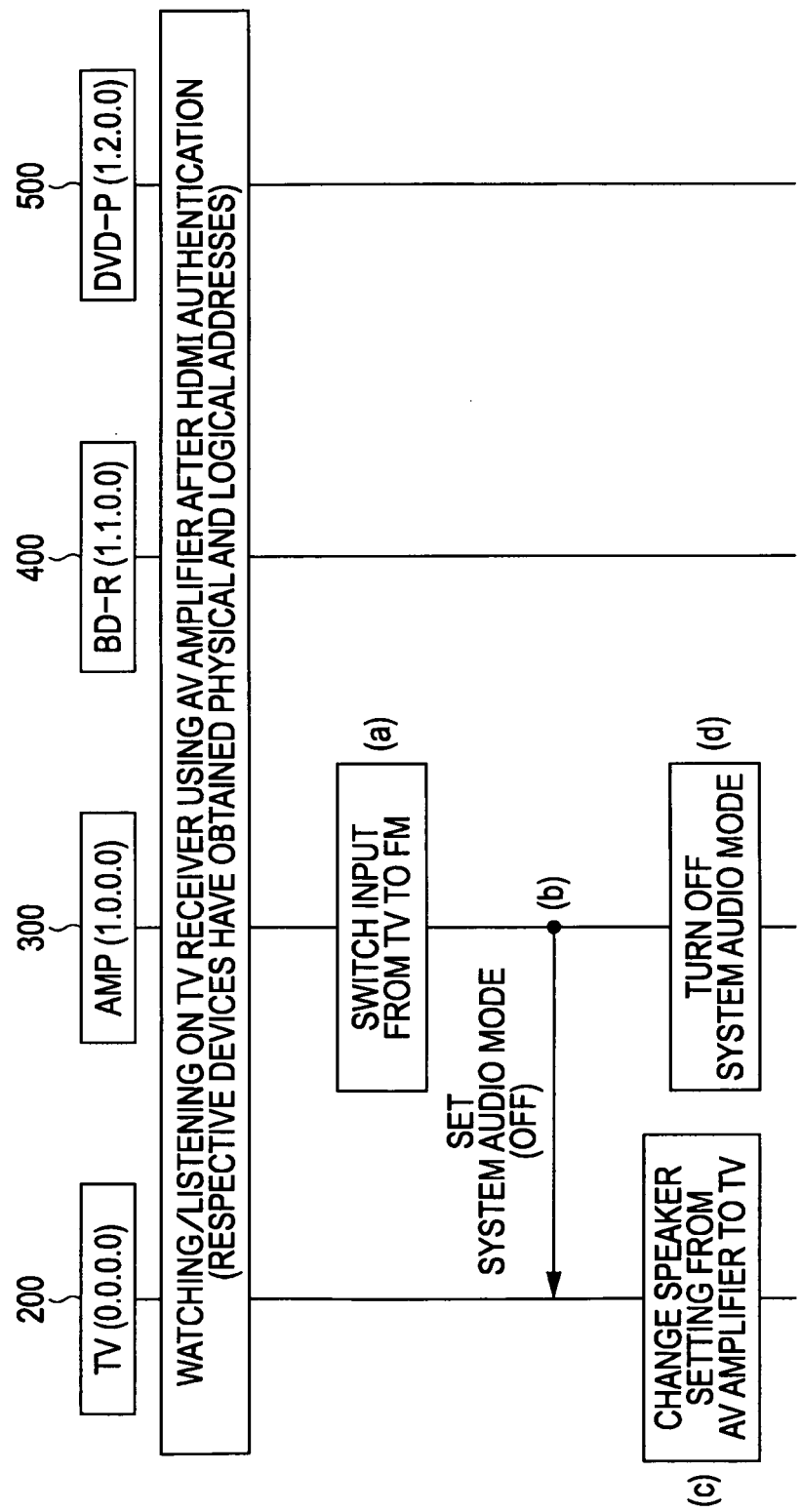

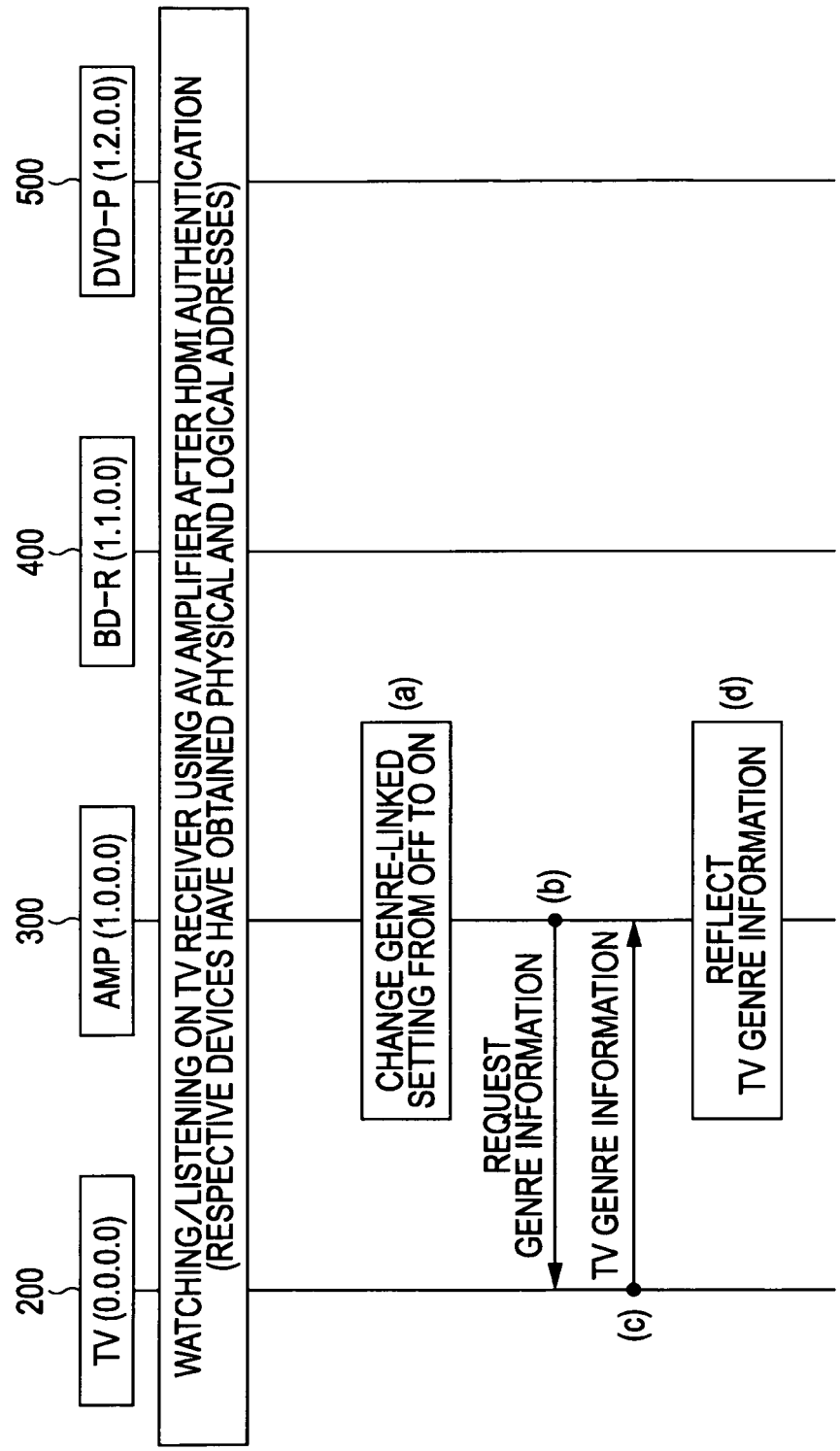

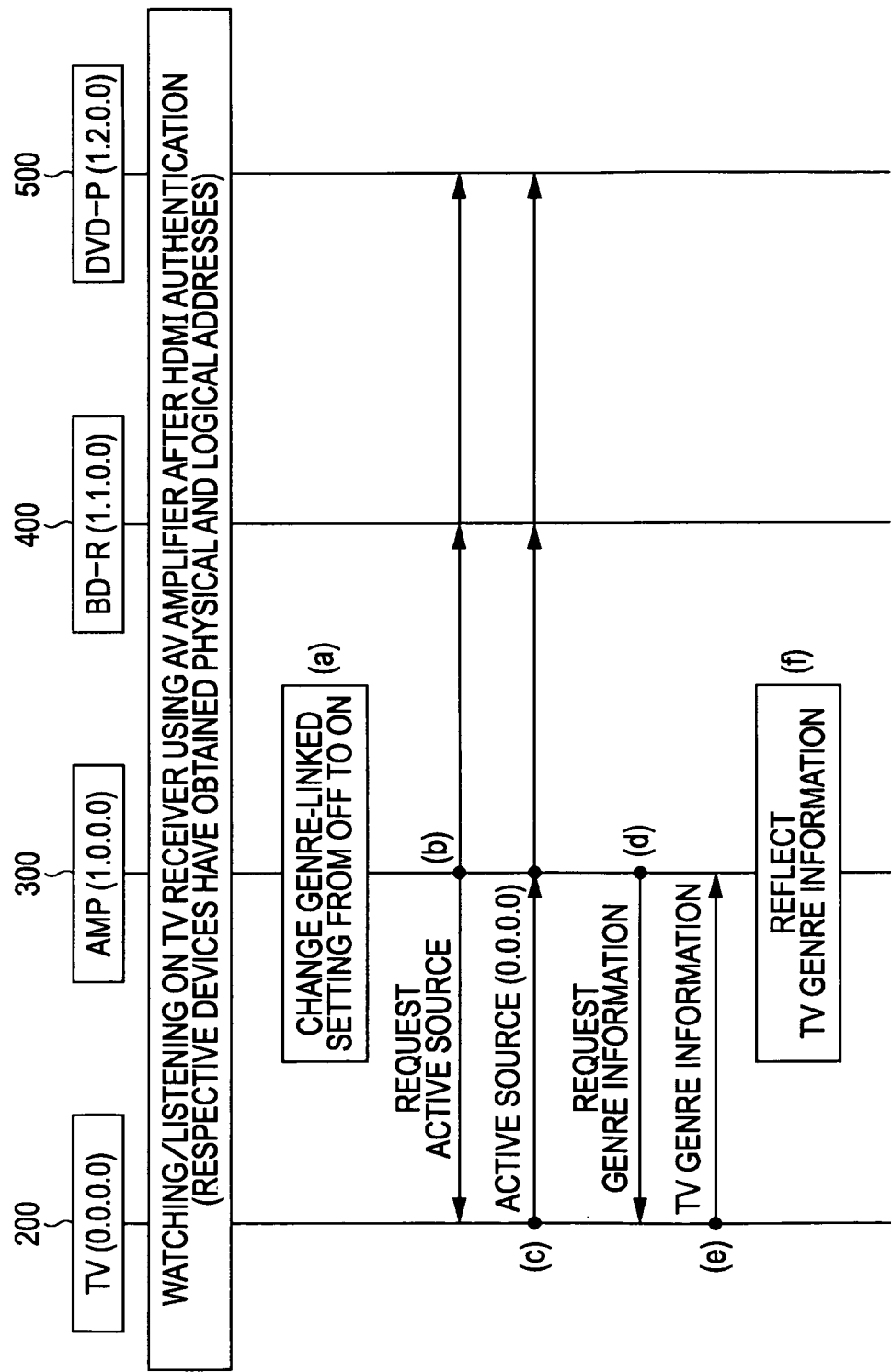

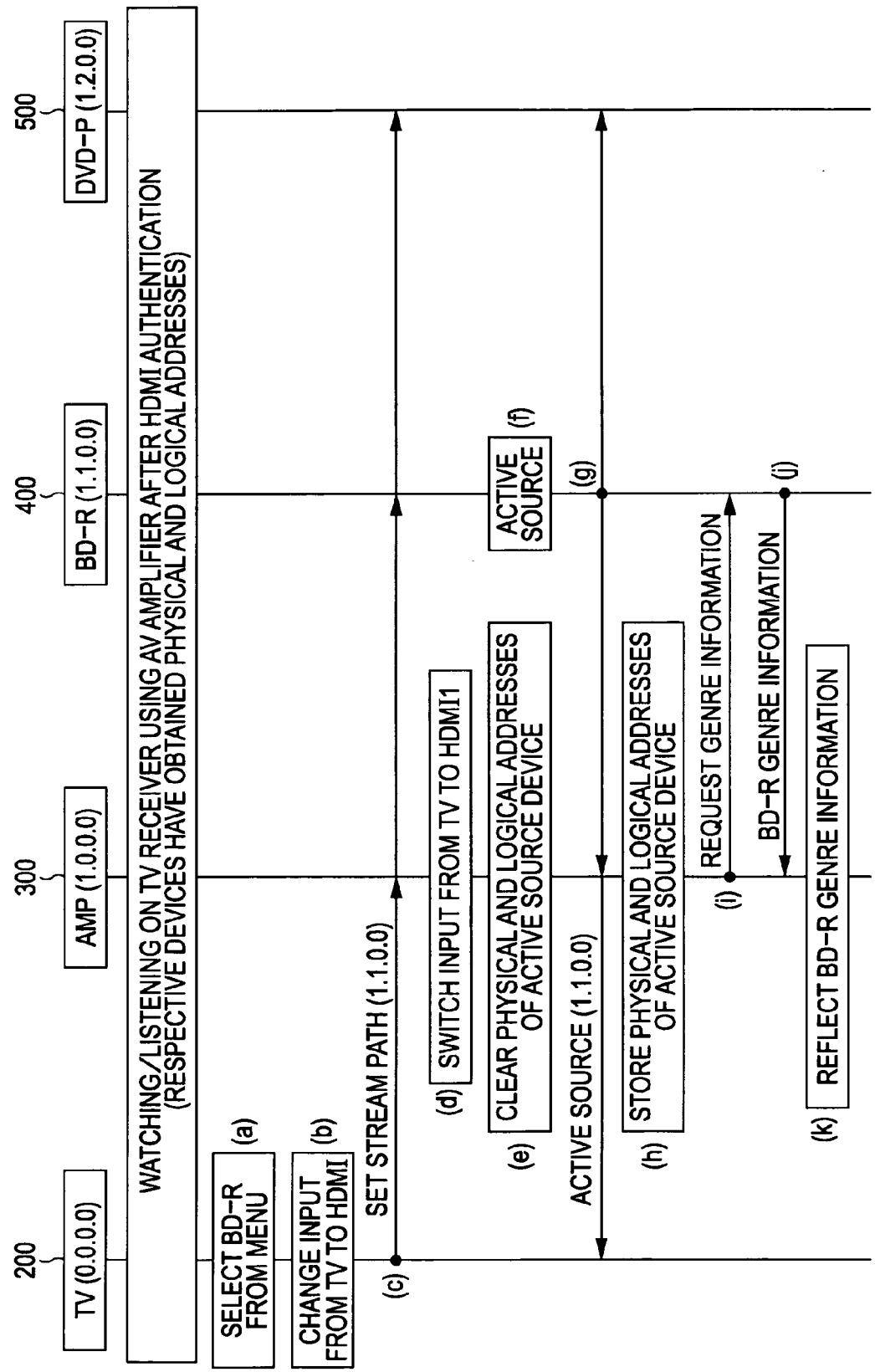

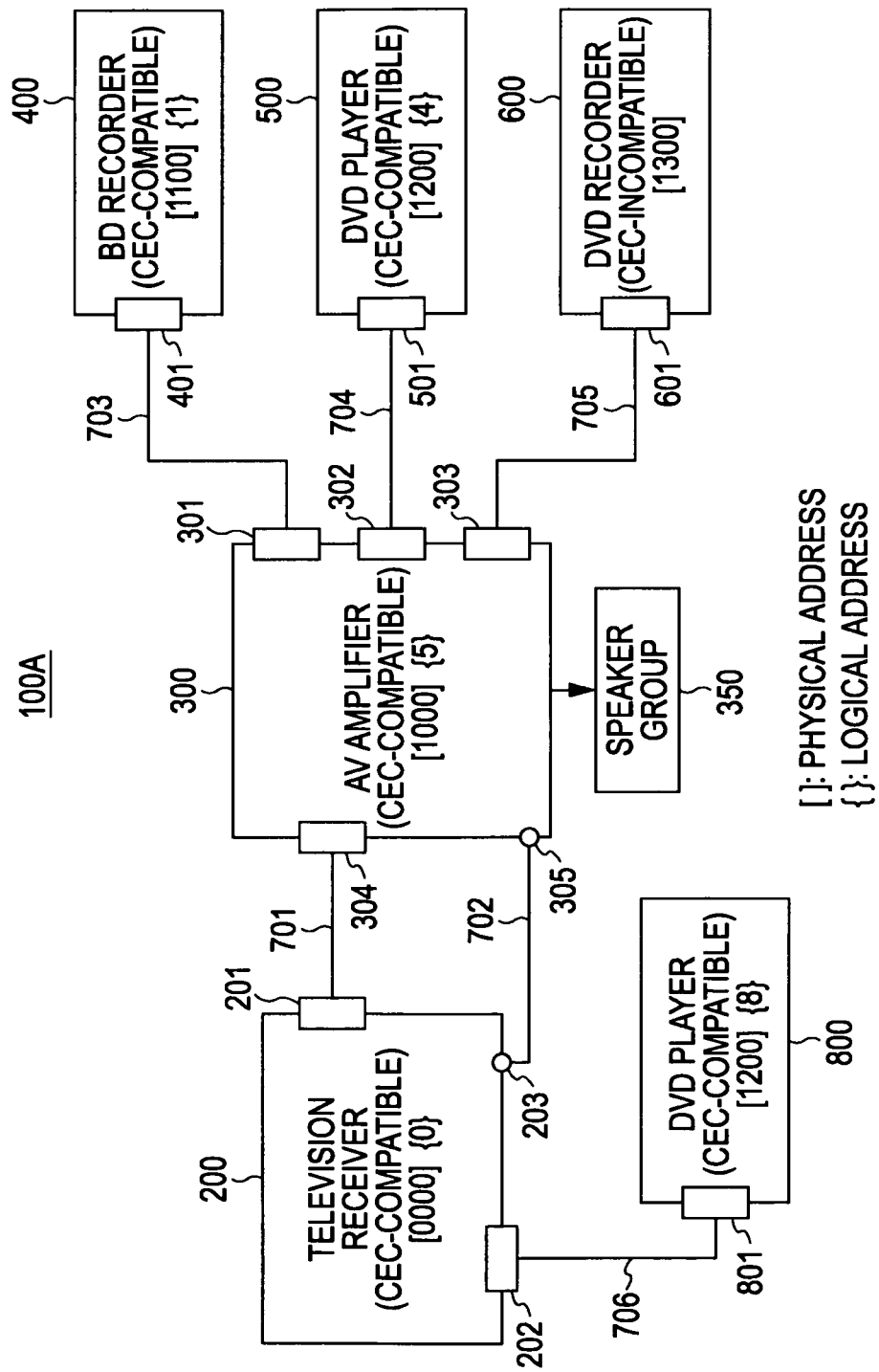

AUDIO PROCESSING DEVICE, AUDIO PROCESSING METHOD, AND PROGRAM

The present application claims priority from Japanese Patent Application No. JP 2008-107498, filed in the Japanese Patent Office on Apr. 17, 2008, the entire content of which is incorporated herein by reference.

BACKGROUND OF THE INVENTION

1. Field of the Invention

The present invention relates to an audio processing device, an audio processing method, and a program that are preferably applied to an AV (Audio Visual) system. More specifically, the present invention relates to an audio processing device, an audio processing method, and a program that enable a favorable process of giving a sound field characteristic to audio signals by giving a sound field characteristic corresponding to received genre information to audio signals of an audio input when the received genre information is determined to be genre information corresponding to the audio input selected by an audio input selecting unit.

2. Description of the Related Art

HDMI (High Definition Multimedia Interface) has become widespread as a digital interface for transmitting video/audio data. HDMI has an audio transmitting function and a copyright protecting function in addition to DVI (Digital Visual Interface), which is a standard of connection between a PC (Personal Computer) and a display, and is arranged for AV (Audio Visual) devices. Non-patent Document 1 (High-Definition Multimedia Interface Specification Version 1.3a, Nov. 10, 2006) describes the details of the HDMI standard.

According to a related art, a plurality of cables for respective signals of video, audio, and control have been used to mutually connect devices. On the other hand, HDMI enables use of a single cable and control signals are compatible with bidirectional transmission. Therefore, by relaying control signals from a monitor to an output device connected by HDMI, such as an STB (Set Top Box) or a DVD (Digital Versatile Disc) player, an entire AV system can be operated by a remote control of the monitor.

In the HDMI standard, inter-device control using CEC (Consumer Electronics Control) is defined. According to CEC, various controls can be performed on the basis of unique physical and logical addresses assigned to respective devices existing on an HDMI network. For example, if playback is performed by a DVD player connected by HDMI when a user is watching/listening to digital broadcast on a television receiver, the television receiver automatically switches ON an input connected to the DVD player. Also, a menu displayed in the DVD player and ON/OFF of the power can be controlled by using a remote control of the television receiver.

In the HDMI standard, operations can be performed even when ten devices at the maximum including a television receiver are mutually connected. That is, nine external devices at the maximum can be connected to a television receiver. When the number of external devices connected to the television receiver is nine or less, any of those devices can be operated by a remote control.

In the above-described case where external devices are operated from a television receiver by using a remote control of the television receiver, the device to be operated can be specified among the plurality of devices by selecting the device having images that are currently displayed in the television receiver.

In the HDMI standard, <Active Source> is defined as a CEC message to indicate the device having images displayed in the television receiver. According to the definition, for example, when a user operates a playback button of a DVD player compatible with the HDMI standard, the DVD player outputs an AV stream and broadcasts an <Active Source> message indicating that the DVD player is an active device if the DVD player is in an active state of being capable of outputting stable video signals.

Here, "broadcast" means transmission of signals to all devices, not to a specific device. The television receiver and the other external devices that have received the broadcasted <Active Source> message change channels in order to play back the AV stream output from the DVD player.

As described above, the HDMI standard defines that a device having images being displayed in the television receiver broadcasts an <Active Source> message to the other devices in the network. The <Active Source> message is one of CEC messages defined by the HDMI standard.

Also, as described in Patent Document 1 (Japanese Unexamined Patent Application Publication No. 2008-35399), there has been realized a function of changing a sound field of an AV amplifier in accordance with genre information of EPG (Electronic Program Guide) of a television receiver by HDMI-CEC. This function is realized by supplying genre information of EPG to an HDMI-CEC line at start of receiving a program or at change of programs in the television receiver and by setting a sound field corresponding to the genre information by the connected AV amplifier.

SUMMARY OF THE INVENTION

Typically, an AV amplifier has an HDMI repeater function, which selects an arbitrary HDMI input from among a plurality of inputs, supplies video and audio signals to a television receiver, and reproduces sound by decoding audio signals. Devices including a television tuner, such as a BD (Blu-ray Disc) recorder and a DVD recorder, are also connected to the AV amplifier. Thus, when the television tuner is operated in the BD recorder or the DVD recorder and when the AV amplifier can operate in conjunction only with the television receiver, conjunction with a program selected by the television tuner of the BD recorder or the DVD recorder is not executed, which is inconvenient.

Genre information based on similar EPGs may be transmitted from the BD recorder and the DVD recorder, and the AV amplifier may operate in conjunction with those devices. However, when it is assumed that both the television receiver and the BD recorder connected to the AV amplifier are in a power-on state and are receiving a program by their television tuners, the following inconvenience occurs.

That is, the respective devices transmit genre information to the AV amplifier when a received program changes. In that case, if the AV amplifier changes sound fields for the respective devices, the sound field may be linked to a side different from the program in which sound is actually reproduced.

The present invention is directed to enabling a favorable process of giving a sound field characteristic.

An audio processing device according to an embodiment includes an audio input selecting unit configured to select a predetermined audio input from among a plurality of audio inputs; a signal processing unit configured to give a predetermined sound field characteristic to audio signals of the audio input selected by the audio input selecting unit; a signal output unit configured to output the audio signals obtained in the signal processing unit; a genre information receiving unit configured to receive genre information transmitted from any of audio signal output devices; and a sound field control unit configured to control the signal processing unit to give a sound field characteristic corresponding to the genre information if the genre information received by the genre information receiving unit is determined to be the genre information corresponding to the audio input selected by the audio input selecting unit.

In the audio processing device, a predetermined sound field characteristic is given to audio signals of the predetermined audio input selected by the audio input selecting unit by the signal processing unit, and the audio signals are output by the signal output unit. In the audio input selecting unit, a predetermined audio input is selected from among a plurality of audio inputs, such as audio signals input to input terminals and audio signals output from a built-in FM tuner or the like. The input terminals include an HDMI terminal and a light input terminal.

The genre information receiving unit receives genre information transmitted from any of the audio signal output devices. The genre information includes genre information of EPG and type information of content played back from a disc. When the received genre information is the genre information corresponding to the audio input selected by the audio input selecting unit, the signal processing unit gives a sound field characteristic corresponding to the genre information to the audio signals of the audio input selected by the audio input selecting unit under control by the sound field control unit. Accordingly, a sound field characteristic is favorably given to the audio signals in the signal processing unit.

The audio processing device may further include HDMI terminals connected to the audio signal output devices to output audio signals corresponding to the plurality of audio inputs. The genre information receiving unit may receive genre information from any of the audio signal output devices through a CEC line. The sound field control unit may determine that the genre information received by the genre information receiving unit is the genre information corresponding to the audio input selected by the audio input selecting unit when a source of the genre information received by the genre information receiving unit is the audio signal output device of an active source. With this determination, it can be prevented that a sound field characteristic is given to audio signals output from the audio signal output device of the active source on the basis of genre information transmitted from a different audio signal output device.

In this case, the sound field control unit receives an active source message from the audio signal output device of the active source through the CEC line and stores a logical address of the source of the active source message. If a logical address of the source of the genre information received by the genre information receiving unit matches the stored logical address, the sound field control unit determines that the genre information received by the genre information receiving unit is the genre information corresponding to the audio input selected by the audio input selecting unit.

The audio processing device may further include HDMI terminals connected to the audio signal output devices to output audio signals corresponding to at least part of the plurality of audio inputs. The genre information receiving unit may receive genre information from any of the audio signal output devices through a CEC line. The sound field control unit may determine that the genre information received by the genre information receiving unit is the genre information corresponding to the audio input selected by the audio input selecting unit when a source of the genre information received by the genre information receiving unit is the audio signal output device to output audio signals corresponding to the audio input selected by the audio input selecting unit. With this determination, it can be prevented that an inappropriate sound field characteristic is given to audio signals on the basis of genre information unrelated to the audio signals when the audio signals corresponding to the audio input selected by the audio input selecting unit are audio signals from a CEC-incompatible device or audio signals from a built-in FM tuner.

In this case, the sound field control unit receives an active source message from the audio signal output device of an active source through a CEC line and stores a logical address and a physical address of the source of the active source message. If a logical address of the source of the genre information received by the genre information receiving unit matches the stored logical address and if the audio input selected by the audio input selecting unit matches the audio input corresponding to the stored physical address, the sound field control unit determines that the genre information received by the genre information receiving unit is the genre information corresponding to the audio input selected by the audio input selecting unit.

The audio processing device may further include a genre information requesting unit configured to request genre information to any of the audio signal output devices. By providing the genre information requesting unit, genre information can be appropriately obtained from the audio signal output device of an active source.

The audio processing device may further include HDMI terminals connected to the audio signal output devices to output audio signals corresponding to at least part of the plurality of audio inputs. The genre information requesting unit requests genre information to any of the audio signal output devices through a CEC line. In this case, the genre information requesting unit requests genre information to the audio signal output device of an active source or requests genre information by broadcast.

The genre information requesting unit requests genre information to any of the audio signal output devices through the CEC line when an active source message is transmitted through the CEC line. Accordingly, genre information can be quickly obtained from the audio signal output device that has newly become an active source, so that a sound field characteristic can be favorably given to audio signals on the basis of the genre information.

The genre information requesting unit requests genre information to the audio signal output device to output audio signals corresponding to a changed audio input when the audio input selected by the audio input selecting unit is changed. Accordingly, genre information can be quickly obtained from the audio signal output device to output audio signals corresponding to the audio input selected by the audio input selecting unit, so that a sound field characteristic can be favorably given to the audio signals on the basis of the genre information.

The audio processing device may further include an output control unit configured to control the signal output unit to start muting when the genre information requesting unit requests genre information and cancel the muting when the genre information receiving unit receives the genre information corresponding to the audio input selected by the audio input selecting unit.

When a request for genre information is made through a CEC line, some time is taken until the request reaches the audio signal output device in CEC communication. Also, some time is taken for the audio signal output device received the request to transmit genre information due to the process. Furthermore, the sound field control unit sets set data to the signal processing unit again when changing setting of the sound field after receiving the genre information, which may cause jumpiness. Therefore, jumpiness may occur after certain time has elapsed from an operation by a user.

As described above, start and cancel of muting are controlled when the genre information requesting unit requests genre information, so that a muting state continues from a user operation to setting of a sound field. Accordingly, jumpiness does not occur after certain time has elapsed from a user's operation, and thus the user does not feel unnaturalness.

The output control unit may cancel the muting if the genre information receiving unit does not receive the genre information corresponding to the audio input selected by the audio input selecting unit within certain time. In that case, continuation of the muting state can be prevented when the audio signal output device to output audio signals corresponding to the audio input selected by the audio input selecting unit does not have a function of transmitting genre information.

The audio processing device may further include a mode setting unit configured to set a genre-linked mode to give a sound field characteristic to output audio signals on the basis of genre information. The genre information requesting unit may request genre information to any of the audio signal output devices when the genre-linked mode is set by the mode setting unit. Also, the audio processing device may further include a set information receiving unit configured to receive set information of a genre-linked mode to give a sound field characteristic to output audio signals on the basis of genre information. The genre information requesting unit may request genre information to any of the audio signal output devices when the genre-linked mode is set on the basis of the set information received by the set information receiving unit. In this case, genre information can be quickly obtained from the audio signal output device to output audio signals corresponding to the audio input selected by the audio input selecting unit, and a sound field characteristic can be favorably given to the audio signals on the basis of the genre information.

The audio processing device may further include a mode setting unit configured to set a system audio mode to output audio signals output from any of the audio signal output devices from the signal output unit. The genre information requesting unit may request genre information to the audio signal output device when the system audio mode is set by the mode setting unit. Also, the audio processing device may further include a set information receiving unit configured to receive set information to set a system audio mode to output audio signals output from any of the audio signal output devices from the signal output unit. The genre information requesting unit may request genre information to the audio signal output device when the system audio mode is set on the basis of the set information received by the set information receiving unit. In this case, genre information can be quickly obtained from the audio signal output device to output audio signals corresponding to the audio input selected by the audio input selecting unit, and a sound field characteristic can be favorably given to the audio signals on the basis of the genre information.

With the above-describe configuration, when received genre information is determined to be genre information corresponding to an audio input selected by the audio input selecting unit, a sound field characteristic corresponding to the received genre information is given to audio signals of the audio input. Accordingly, a process of giving a sound field characteristic to audio signals can be favorably performed.

BRIEF DESCRIPTION OF THE DRAWINGS

FIG. 2 illustrates a CEC table showing the correspondence between devices and CEC logical addresses;

FIG. 3 illustrates an example of the correspondence between genre information and sound fields;

FIG. 4 illustrates features of respective sound field characteristics given in an AV amplifier;

FIG. 11 illustrates a pin array (type A) of HDMI terminals;

FIG. 29 illustrates an operation sequence performed when input of the AV amplifier is switched from TV to FM during watching/listening on TV using the AV amplifier;

FIG. 30 illustrates an operation sequence performed when input of the AV amplifier is switched from TV to FM during watching/listening on TV using the AV amplifier;

FIG. 31 illustrates an operation sequence performed when a genre-linked mode is changed from an OFF state to an ON state during watching/listening on TV using the AV amplifier;

FIG. 32 illustrates an operation sequence performed when a genre-linked mode is changed from an OFF state to an ON state during watching/listening on TV using the AV amplifier;

FIG. 33 illustrates an operation sequence performed when the BD recorder is selected from the TV during watching/listening on TV using the AV amplifier; and FIG. 34 is a block diagram illustrating an example of the configuration of an AV system according to another embodiment of the present invention.

DESCRIPTION OF THE PREFERRED EMBODIMENTS

Figure 1:
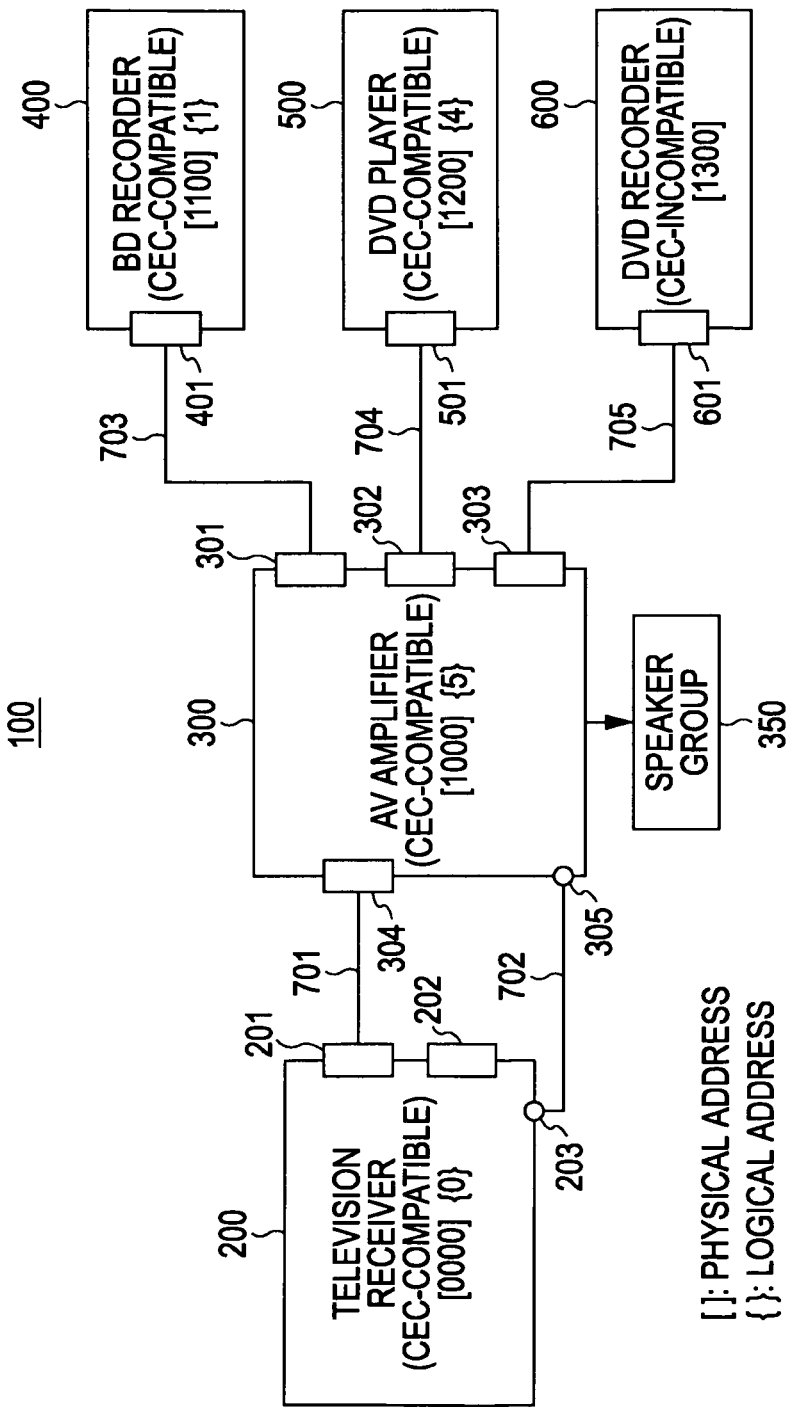
FIG. 1 is a block diagram illustrating an example of the configuration of an AV system according to an embodiment of the present invention.

Hereinafter, embodiments of the present invention are described with reference to the drawings. FIG. 1 illustrates an example of the configuration of an AV system 100 according to an embodiment.

The AV system 100 includes a television receiver 200, an AV amplifier 300, a BD recorder 400, a DVD player 500, and a DVD recorder 600. The BD recorder 400, the DVD player 500, and the DVD recorder 600 serve as a source device of HDMI. The AV amplifier 300 serves as a repeater device of HDMI. The television receiver 200 serves as a sink device of HDMI.

The television receiver 200 is compatible with CEC and includes HDMI terminals 201 and 202 and a light output terminal 203. The BD recorder 400 is compatible with CEC and includes an HDMI terminal 401. The DVD player 500 is compatible with CEC and includes an HDMI terminal 501. The DVD recorder 600 is incompatible with CEC and includes an HDMI terminal 601.

The AV amplifier 300 is compatible with CEC and includes HDMI terminals 301, 302, 303, and 304 and a light input terminal 305. The AV amplifier 300 connects to a speaker group 350. The speaker group 350 includes speakers placed on front, front-right, front-left, rear-right, and rear-left of a listener and a bass subwoofer speaker, that realize 5.1 ch surround, for example.

The television receiver 200 connects to the AV amplifier 300 through an HDMI cable 701 and an optical cable 702. Specifically, one end of the HDMI cable 701 connects to the HDMI terminal 201 of the television receiver 200 and the other end thereof connects to the HDMI terminal 304 of the AV amplifier 300. One end of the optical cable 702 connects to the light output terminal 203 of the television receiver 200 and the other end thereof connects to the light input terminal 305 of the AV amplifier 300.

The AV amplifier 300 connects to the BD recorder 400 through an HDMI cable 703. Specifically, one end of the HDMI cable 703 connects to the HDMI terminal 301 of the AV amplifier 300 and the other end thereof connects to the HDMI terminal 401 of the BD recorder 400.

Also, the AV amplifier 300 connects to the DVD layer 500 through an HDMI cable 704. Specifically, one end of the HDMI cable 704 connects to the HDMI terminal 302 of the AV amplifier 300 and the other end thereof connects to the HDMI terminal 501 of the DVD player 500.

Furthermore, The AV amplifier 300 connects to the DVD recorder 600 through an HDMI cable 705. Specifically, one end of the HDMI cable 705 connects to the HDMI terminal 303 of the AV amplifier 300 and the other end thereof connects to the HDMI terminal 601 of the DVD recorder 600.

In the AV system 100 illustrates in FIG. 1, a physical addresses and a CEC logical addresses of the respective devices are obtained in the following manner, for example.

That is, when the AV amplifier 300 is connected to the television receiver 200 (physical address is [0000] and CEC logical address is {0}) through the HDMI cable 701, the AV amplifier 300 obtains a physical address [1000] from the television receiver 200 by using an HDMI control protocol.

The CEC-compatible device is specified to obtain a logical address at HDMI connection. The CEC-compatible device transmits/receives a message by using the logical address. FIG. 2 illustrates a table showing the correspondence between devices and CEC logical addresses. In the table, "TV" in the device field includes a television set, a projector, and the like. "Recording Device" in the device field includes a BD recorder, a DVD recorder, and the like. "Tuner" in the device field includes an STB (Set Top Box) and the like. "Playback Device" in the device field includes a DVD player, a camcoder, and the like. "Audio System" in the device field includes an AV amplifier and the like.

The AV amplifier 300 is a CEC-compatible device, as described above. The AV amplifier 300 sets a logical address {5} as "Audio System" on the basis of the table in FIG. 2. In this case, the AV amplifier 300 recognizes that there is no other device having the logical address {5} by using a Polling Message of the CEC control protocol and then sets the logical address {5} as an own logical address. Then, the AV amplifier 300 notifies the television receiver 200 that the physical address [1000] corresponds to the CEC-compatible device {5} by using a Report Physical Address of the CEC control protocol.

When the BD recorder 400 is connected to the AV amplifier 300 through the HDMI cable 703, the BD recorder 400 obtains a physical address [1100] from the AV amplifier 300 by using the HDMI control protocol.

The BD recorder 400 is a CEC-compatible device, as described above. The BD recorder 400 sets a logical address {1} as "Recording Device" on the basis of the table in FIG. 2. In this case, the BD recorder 400 recognizes that there is no other device having the logical address {1} by using a Polling Message of the CEC control protocol and then sets the logical address {1} as an own logical address. Then, the BD recorder 400 notifies the television receiver 200 and the AV amplifier 300 that the physical address [1100] corresponds to the CEC-compatible device {1} by using a Report Physical Address of the CEC control protocol.

When the DVD player 500 is connected to the AV amplifier 300 through the HDMI cable 704, the DVD player 500 obtains a physical address [1200] from the AV amplifier 300 by using the HDMI control protocol.

The DVD player 500 is a CEC-compatible device, as described above. The DVD player 500 sets a logical address {4} as "Playback Device" on the basis of the table in FIG. 2. In this case, the DVD player 500 recognizes that there is no other device having the logical address {4} by using a Polling Message of the CEC control protocol and then sets the logical address {4} as an own logical address. Then, the DVD player 500 notifies the television receiver 200 and the AV amplifier 300 that the physical address [1200] corresponds to the CEC-compatible device {4} by using a Report Physical Address of the CEC control protocol.

When the DVD recorder 600 is connected to the AV amplifier 300 through the HDMI cable 705, the DVD recorder 600 obtains a physical address [1300] from the AV amplifier 300 by using the HDMI control protocol. Since the DVD recorder 600 is a CEC-incompatible device, as described above, a logical address is not obtained.

When a program selected by a tuner of the television receiver 200 is watched/listened to in the AV system 100 illustrated in FIG. 1, the following is performed. That is, images based on video signals obtained by the tuner are displayed on a display panel (not illustrated) of the television receiver 200. Voices based on audio signals obtained by the tuner are output from a speaker (not illustrated) of the television receiver 200 when the AV amplifier 300 is in a system audio mode OFF state. When the AV amplifier 300 is in a system audio mode ON state, voices based on audio signals obtained by the tuner are output from the speaker group 350 connected to the AV amplifier 300.

The audio signals obtained by the tuner of the television receiver 200 are regarded as optical digital audio signals of an S/PDIF (SonyPhilips Digital InterFace) standard and are supplied to the AV amplifier 300 through the optical cable 702. Setting of ON/OFF of the system audio mode in the AV amplifier 300 can be performed by a user by operating a user operation unit (not illustrated) of the AV amplifier 300 or by operating a user operation unit (not illustrated) of the television receiver 200.

When the audio signals obtained by the tuner of the television receiver 200 are output from the speaker group 350 connected to the AV amplifier 300 and when the AV amplifier 300 is in a genre-linked mode ON state, the following is performed. That is, in the AV amplifier 300, a sound field characteristic is given to audio signals from the television receiver 200 on the basis of genre information of the EPG supplied from the television receiver 200 to the AV amplifier 300 through a CEC line. Setting of ON/OFF of the genre-linked mode in the AV amplifier 300 can be performed by a user by operating the user operation unit (not illustrated) of the AV amplifier 300 or by operating the user operation unit (not illustrated) of the television receiver 200.

FIG. 3 illustrates an example of the correspondence between genre information and sound fields. FIG. 4 illustrates features of respective sound field characteristics given in the AV amplifier 300.

In the AV system 100 illustrated in FIG. 1, the following is performed to watch/listen to content played back from a disc in the BD recorder 400 or a program selected by the tuner by performing switching from the television receiver 200 or by operating a playback button of the BD recorder 400.

That is, images based on video signals output from the BD recorder 400 are displayed on the display panel (not illustrated) of the television receiver 200. In this case, the video signals output from the BD recorder 400 are supplied to the television receiver 200 through the HDMI cable 703, the AV amplifier 300, and the HDMI cable 701.

Voices based on audio signals output from the BD recorder 400 are output from the speaker (not illustrated) of the television receiver 200 when the AV amplifier 300 is in a system audio mode OFF state. In this case, the audio signals output from the BD recorder 400 are supplied to the television receiver 200 through the HDMI cable 703, the AV amplifier 300, and the HDMI cable 701.

Voices based on audio signals output from the BD recorder 400 are output from the speaker group 350 connected to the AV amplifier 300 when the AV amplifier 300 is in a system audio mode ON state. In this case, the audio signals output from the BD recorder 400 are supplied to the AV amplifier 300 through the HDMI cable 703.

In this case, the following is performed when the AV amplifier 300 is in a genre-linked mode ON state. That is, in the AV amplifier 300, a sound field characteristic is given to the audio signals from the BD recorder 400 on the basis of genre information (genre information of EPG, type information of content played back from a disc, etc.) supplied from the BD recorder 400 to the AV amplifier 300 through a CEC line (see FIGS. 3 and 4).

In the AV system 100 illustrated in FIG. 1, the following is performed to watch/listen to content played back from a disc in the DVD player 500 by performing switching from the television receiver 200 or by operating a playback button of the DVD player 500.

That is, images based on video signals output from the DVD player 500 are displayed on the display panel (not illustrated) of the television receiver 200. In this case, the video signals output from the DVD player 500 are supplied to the television receiver 200 through the HDMI cable 704, the AV amplifier 300, and the HDMI cable 701.

Voices based on audio signals output from the DVD player 500 are output from the speaker (not illustrated) of the television receiver 200 when the AV amplifier 300 is in a system audio mode OFF state. In this case, the audio signals output from the DVD player 500 are supplied to the television receiver 200 through the HDMI cable 704, the AV amplifier 300, and the HDMI cable 701.

Voices based on audio signals output from the DVD player 500 are output from the speaker group 350 connected to the AV amplifier 300 when the AV amplifier 300 is in a system audio mode ON state. In this case, the audio signals output from the DVD player 500 are supplied to the AV amplifier 300 through the HDMI cable 704.

In this case, the following is performed when the AV amplifier 300 is in a genre-linked mode ON state. That is, in the AV amplifier 300, a sound field characteristic is given to the audio signals from the DVD player 500 on the basis of genre information (disc type information indicating content in the disc to be played back, etc.) supplied from the DVD player 500 to the AV amplifier 300 through a CEC line (see FIGS. 3 and 4).

In the AV system 100 illustrated in FIG. 1, the following is performed to watch/listen to content played back from a disc in the DVD recorder 600 or a program selected by the tuner by performing switching from the television receiver 200.

That is, images based on video signals output from the DVD recorder 600 are displayed on the display panel (not illustrated) of the television receiver 200. In this case, the video signals output from the DVD recorder 600 are supplied to the television receiver 200 through the HDMI cable 705, the AV amplifier 300, and the HDMI cable 701.

Voices based on audio signals output from the DVD recorder 600 are output from the speaker (not illustrated) of the television receiver 200 when the AV amplifier 300 is in a system audio mode OFF state. In this case, the audio signals output from the DVD recorder 600 are supplied to the television receiver 200 through the HDMI cable 705, the AV amplifier 300, and the HDMI cable 701.

Voices based on audio signals output from the DVD recorder 600 are output from the speaker group 350 connected to the AV amplifier 300 when the AV amplifier 300 is in a system audio mode ON state. In this case, the audio signals output from the DVD recorder 600 are supplied to the AV amplifier 300 through the HDMI cable 705.

In this case, since the DVD recorder 600 is incompatible with CEC, genre information (disc type information indicating content in the disc to be played back, etc.) is not supplied from the DVD recorder 600 to the AV amplifier 300 through a CEC line. Therefore, in the AV amplifier 300, a sound field characteristic "standard" is given to the audio signals from the DVD recorder 600 even in a genre-linked mode ON state. That is, no particular audio processing is performed.

Figure 5:
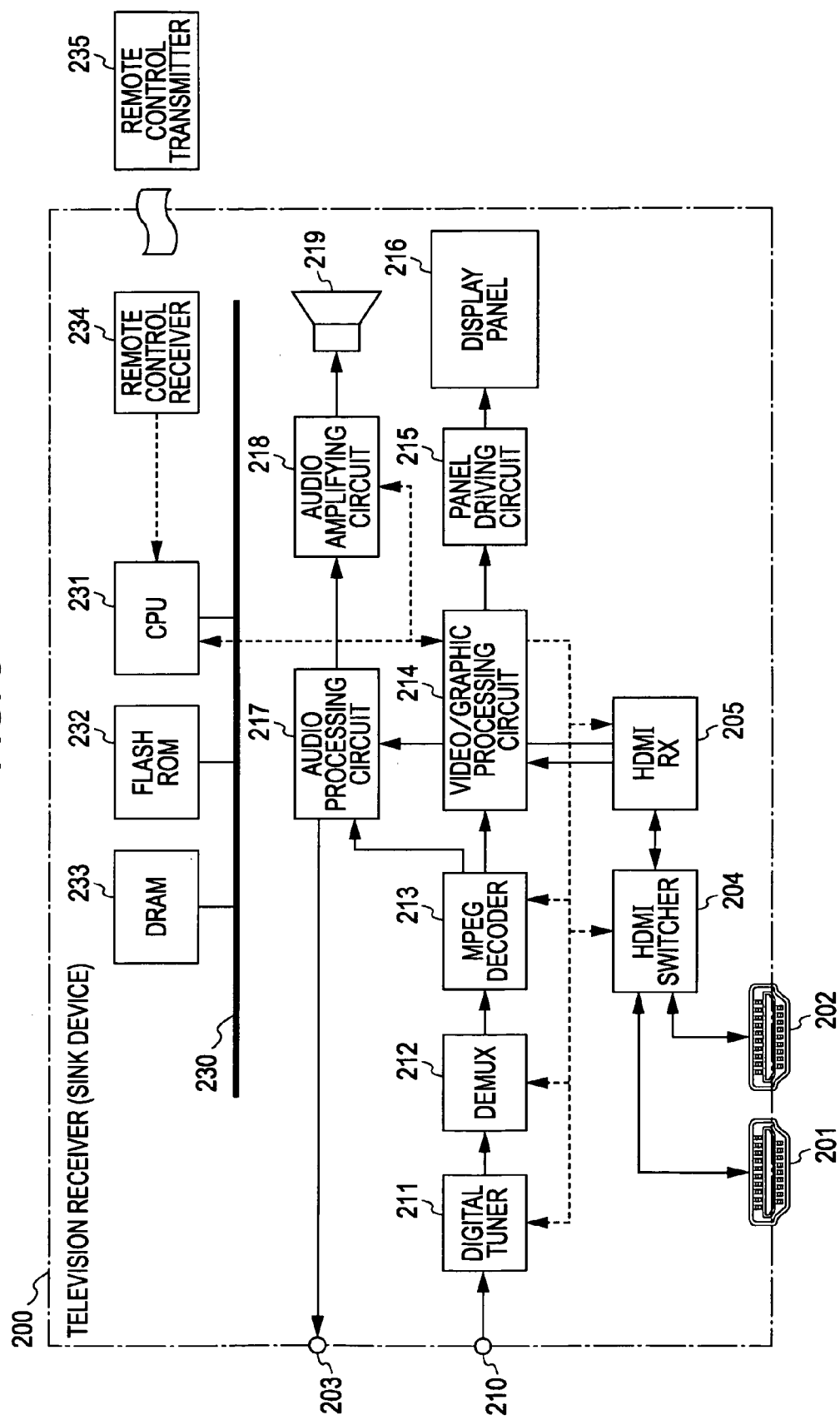
FIG. 5 is a block diagram illustrating an example of the configuration of a television receiver (sink device) included in the AV system.

FIG. 5 illustrates an example of the configuration of the television receiver 200. The television receiver 200 includes the HDMI terminals 201 and 202, an HDMI switcher 204, an HDMI receiving unit 205, an antenna terminal 210, a digital tuner 211, a demultiplexer 212, an MPEG (Moving Picture Experts Group) decoder 213, a video/graphic processing circuit 214, a panel driving circuit 215, a display panel 216, an audio processing circuit 217, an audio amplifying circuit 218, a speaker 219, an internal bus 230, a CPU (Central Processing Unit) 231, a flash ROM (Read Only Memory) 232, a DRAM (Dynamic Random Access Memory) 233, a remote control receiver 234, and a remote control transmitter 235.

The CPU 231 controls operations of the respective units of the television receiver 200. The flash ROM 232 stores control software and data. The DRAM 233 serves as a work area of the CPU 231. The CPU 231 expands the software and data read from the flash ROM 232 on the DRAM 233 and starts the software, so as to control the respective units of the television receiver 200. The CPU 231, the flash ROM 232, and the DRAM 233 connect to the internal bus 230.

The remote control receiver 234 receives infrared remote control signals (remote control code) transmitted from the remote control transmitter 235 and supplies the signals to the CPU 231. A user can operate the television receiver 200 and other CEC-compatible devices connected to the television receiver 200 through HDMI cables by operating the remote control transmitter 235.

The antenna terminal 210 is a terminal to input television broadcast signals received by a receiving antenna (not illustrated). The digital tuner 211 processes the television broadcast signals input to the antenna terminal 210 and outputs a predetermined transport stream corresponding to a channel selected by the user. The demultiplexer 212 extracts a partial TS (Transport Stream) (TS packets of video data and TS packets of audio data) corresponding to the channel selected by the user from the transport stream obtained from the digital tuner 211.

The demultiplexer 212 also extracts PSI/SI (Program Specific Information/Service Information) from the transport stream obtained from the digital tuner 211 and outputs it to the CPU 231. In the transport stream obtained from the digital tuner 211, a plurality of channels are multiplexed. The process of extracting a partial TS of an arbitrary channel from the transport stream in the demultiplexer 212 can be performed by obtaining information of a packet ID (PID) of the arbitrary channel from the PSI/SI (PAT/PMT: Program Association Table/Program Map Table).

The MPEG decoder 213 obtains video data by performing a decoding process on video PES (Packetized Elementary Stream) packets constituted by TS packets of video data obtained from the demultiplexer 212. Also, the MPEG decoder 213 obtains audio data by performing a decoding process on audio PES packets constituted by TS packets of audio data obtained from the demultiplexer 212.

The video/graphic processing circuit 214 performs a scaling process and a graphic data superimposing process as necessary on the video data obtained from the MPEG decoder 213. The panel driving circuit 215 drives the display panel 216 on the basis of the video data output from the video/graphic processing circuit 214. The display panel 216 includes an LCD (Liquid Crystal Display), a PDP (Plasma Display Panel), or the like.

The audio processing circuit 217 performs a necessary process, such as D/A conversion, on the audio data obtained from the MPEG decoder 213. The audio amplifying circuit 218 amplifies analog audio signals output from the audio processing circuit 217 and supplies the signals to the speaker 219. Also, the audio processing circuit 217 converts the audio data obtained from the MPEG decoder 213 to digital light signals of the S/PDIF standard, for example, and outputs the signals to the light output terminal 203.

The HDMI switcher 204 selectively connects the HDMI terminals 201 and 202 to the HDMI receiving unit 205. The HDMI receiving unit 205 is selectively connected to any of the HDMI terminals 201 and 202 via the HDMI switcher 204. The HDMI receiving unit 205 receives baseband video and audio data that is unidirectionally transmitted from an external device (source device or repeater device) connected to the HDMI terminal 201 or 202 through communication compatible with HDMI. The details of the HDMI receiving unit 205 are described below.

Now, operations of the television receiver 200 illustrated in FIG. 5 are briefly described. Television broadcast signals input to the antenna terminal 210 are supplied to the digital tuner 211. In the digital tuner 211, the television broadcast signals are processed, whereby a transport stream corresponding to the channel selected by the user can be obtained. This transport stream is supplied to the demultiplexer 212. In the demultiplexer 212, a partial TS (TS packets of video data and TS packets of audio data) corresponding to the channel selected by the user is extracted from the transport stream. The partial TS is supplied to the MPEG decoder 213.

In the MPEG decoder 213, a decoding process is performed on video PES packets constituted by the TS packets of video data, so that video data can be obtained. A scaling process, a graphic data superimposing process, and so on are performed as necessary on the video data in the video/graphic processing circuit 214, and then the video data is supplied to the panel driving circuit 215. Accordingly, images corresponding to the channel selected by the user are displayed on the display panel 216.

Also, in the MPEG decoder 213, a decoding process is performed on audio PES packets constituted by the TS packets of audio data, so that audio data can be obtained. A necessary process such as D/A conversion is performed on the audio data in the audio processing circuit 217. Furthermore, the audio data is amplified by the audio amplifying circuit 218, and is then supplied to the speaker 219. Accordingly, voices corresponding to the channel selected by the user are output from the speaker 219.

The audio data obtained in the MPEG decoder 213 is converted to digital light signals of the S/PDIF standard by the audio processing circuit 217, and the signals are output to the light output terminal 203. Accordingly, the audio data can be transmitted to an external device through an optical cable. In the AV system 100 illustrated in FIG. 1, the audio data from the television receiver 200 is supplied to the AV amplifier 300 through the optical cable 702, as described above.

When the AV amplifier 300 is in a system audio mode ON state, voices based on audio data from the television receiver 200 are output from the speaker group 350 connected to the AV amplifier 300. In this case, the audio amplifying circuit 218 is brought into a muting state by the CPU 231, so that no voice is output from the speaker 219 of the television receiver 200.

In the HDMI receiving unit 205, video and audio data input to the HDMI terminals 201 and 202 through the HDMI cable can be obtained. The video data is supplied to the video/graphic processing circuit 214. The audio data is supplied to the audio processing circuit 217. After that, the same operation as that performed when television broadcast signals are received described above is performed, whereby images are displayed on the display panel 216 and voices are output from the speaker 219.

In the case of watching/listening to images and voices based on video data and audio data from the BD recorder 400, the DVD player 500, or the DVD recorder 600 in the AV system 100 illustrated in FIG. 1, images and voices based on the video data and audio data obtained by the HDMI receiving unit 205 are watched/listened to, as described above.

In this case, too, when the AV amplifier 300 is in a system audio mode ON state, voices based on the audio data are output from the speaker group 350 connected to the AV amplifier 300. The audio amplifying circuit 218 of the television receiver 200 is brought into a muting state, so that no voice is output from the speaker 219.

Figure 6:
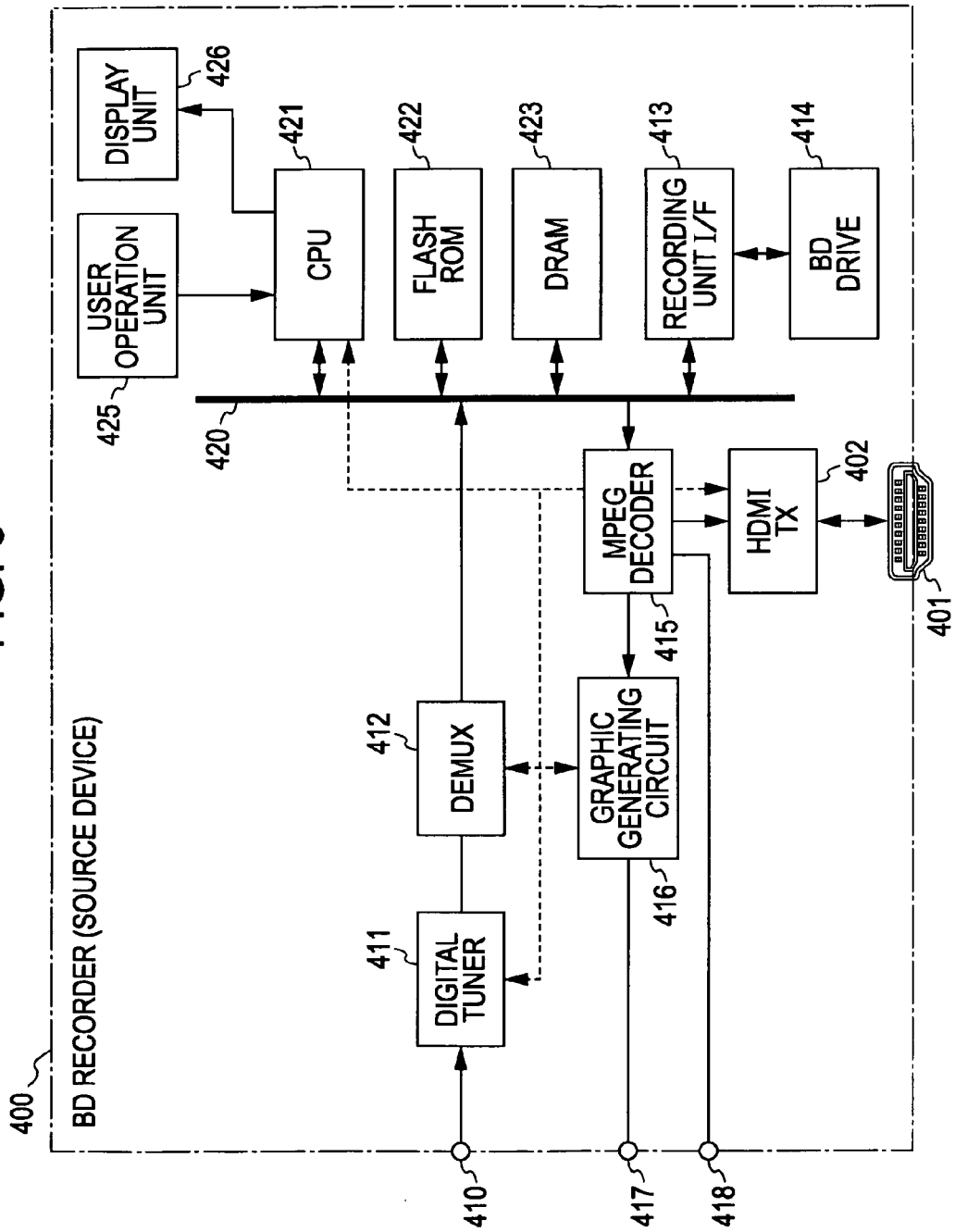
FIG. 6 is a block diagram illustrating an example of the configuration of a BD recorder (source device) included in the AV system.

FIG. 6 illustrates an example of the configuration of the BD recorder 400. The BD recorder 400 includes the HDMI terminal 401, an HDMI transmitting unit 402, an antenna terminal 410, a digital tuner 411, a demultiplexer 412, a recording unit interface 413, a BD drive 414, an MPEG decoder 415, a graphic generating circuit 416, a video output terminal 417, an audio output terminal 418, an internal bus 420, a CPU 421, a flash ROM 422, and a DRAM 423.

The CPU 421 controls operations of the respective units of the BD recorder 400. The flash ROM 422 stores control software and data. The DRAM 423 serves as a work area of the CPU 421. The CPU 421 expands the software and data read from the flash ROM 422 on the DRAM 423 and starts the software, so as to control the respective units of the BD recorder 400. The CPU 421, the flash ROM 422, the DRAM 423, the demultiplexer 412, and the recording unit interface 413 connect to the internal bus 420.

The CPU 421 connects to a user operation unit 425 and a display unit 426. The user operation unit 425 and the display unit 426 constitute a user interface. The user can operate the BD recorder 400 by using the user operation unit 425. The user operation unit 425 includes a key, a button, a dial, and a remote control transmitter/receiver that are placed on a casing (not illustrated) of the BD recorder 400. The display unit 426 displays an operation status of the BD recorder 400 and an operation status of the user and includes an LCD (Liquid Crystal Display) or the like.

The antenna terminal 410 is a terminal to input television broadcast signals received by a receiving antenna (not illustrated). The digital tuner 411 processes the television broadcast signals input to the antenna terminal 410 and outputs a predetermined transport stream. The demultiplexer 412 extracts a partial TS (Transport Stream) (TS packets of video data and TS packets of audio data) corresponding to a predetermined selected channel from the transport stream obtained from the digital tuner 411.

The demultiplexer 412 also extracts PSI/SI (Program Specific Information/Service Information) from the transport stream obtained from the digital tuner 411 and outputs it to the CPU 421. In the transport stream obtained from the digital tuner 411, a plurality of channels are multiplexed. The process of extracting a partial TS of an arbitrary channel from the transport stream in the demultiplexer 412 can be performed by obtaining information of a packet ID (PID) of the arbitrary channel from the PSI/SI (PAT/PMT).

The BD drive 414 connects to the internal bus 420 via the recording unit interface 413. The BD drive 414 records the partial TS extracted by the demultiplexer 412 on a disc during recording. Also, the BD drive 414 plays back the partial TS recorded on the disc during playback.

The MPEG decoder 415 performs a decoding process on video PES packets constituting the partial TS extracted by the demultiplexer 412 or played back by the BD drive 414, so as to obtain video data. Also, the MPEG decoder 415 performs a decoding process on audio PES packets constituting the partial TS, so as to obtain audio data.

The graphic generating circuit 416 performs a graphic data superimposing process or the like as necessary on the video data obtained from the MPEG decoder 415. The video output terminal 417 outputs video data output from the graphic generating circuit 416. The audio output terminal 418 outputs audio data obtained from the MPEG decoder 415.

The HDMI transmitting unit (HDMI source) 402 transmits baseband video and audio data obtained from the MPEG decoder 415 from the HDMI terminal 401 by communication compatible with HDMI. The details of the HDMI transmitting unit 402 are described below.

Now, operations of the BD recorder 400 illustrated in FIG. 6 are briefly described.

Television broadcast signals input to the antenna terminal 410 are supplied to the digital tuner 411. In the digital tuner 411, the television broadcast signals are processed and a predetermined transport stream is extracted. This transport stream is supplied to the demultiplexer 412. In the demultiplexer 412, a partial TS (TS packets of video data and TS packets of audio data) corresponding to a predetermined channel is extracted from the transport stream. The partial TS is supplied to the BD drive 414 via the recording unit interface 413 and is recorded on the basis of recording instructions from the CPU 421.

As described above, the partial TS extracted by the demultiplexer 412 or the partial TS played back by the BD drive 414 is supplied to the MPEG decoder 415. In the MPEG decoder 415, a decoding process is performed on video PES packets constituted by TS packets of video data, whereby video data can be obtained. A graphic data superimposing process is performed on the video data in the graphic generating circuit 416, and the video data is output to the video output terminal 417. Also, in the MPEG decoder 415, a decoding process is performed on audio PES packets constituted by TS packets of audio data, whereby audio data can be obtained. The audio data is output to audio output terminal 418.

As described above, baseband video and audio data obtained in the MPEG decoder 415 is supplied to the HDMI transmitting unit 402 and is transmitted from the HDMI transmitting unit 402 to an external device via the HDMI terminal 401.

Although a detailed description is omitted, the configuration of the DVD player 500 is the same as that of the above-described BD recorder 400 except that a DVD drive is provided instead of the BD drive 414 and that the recording system is not provided. Likewise, although a detailed description is omitted, the configuration of the DVD recorder 600 is the same as that of the above-described BD recorder 400 except that a DVD drive is provided instead of the BD drive 414.

Figure 7:
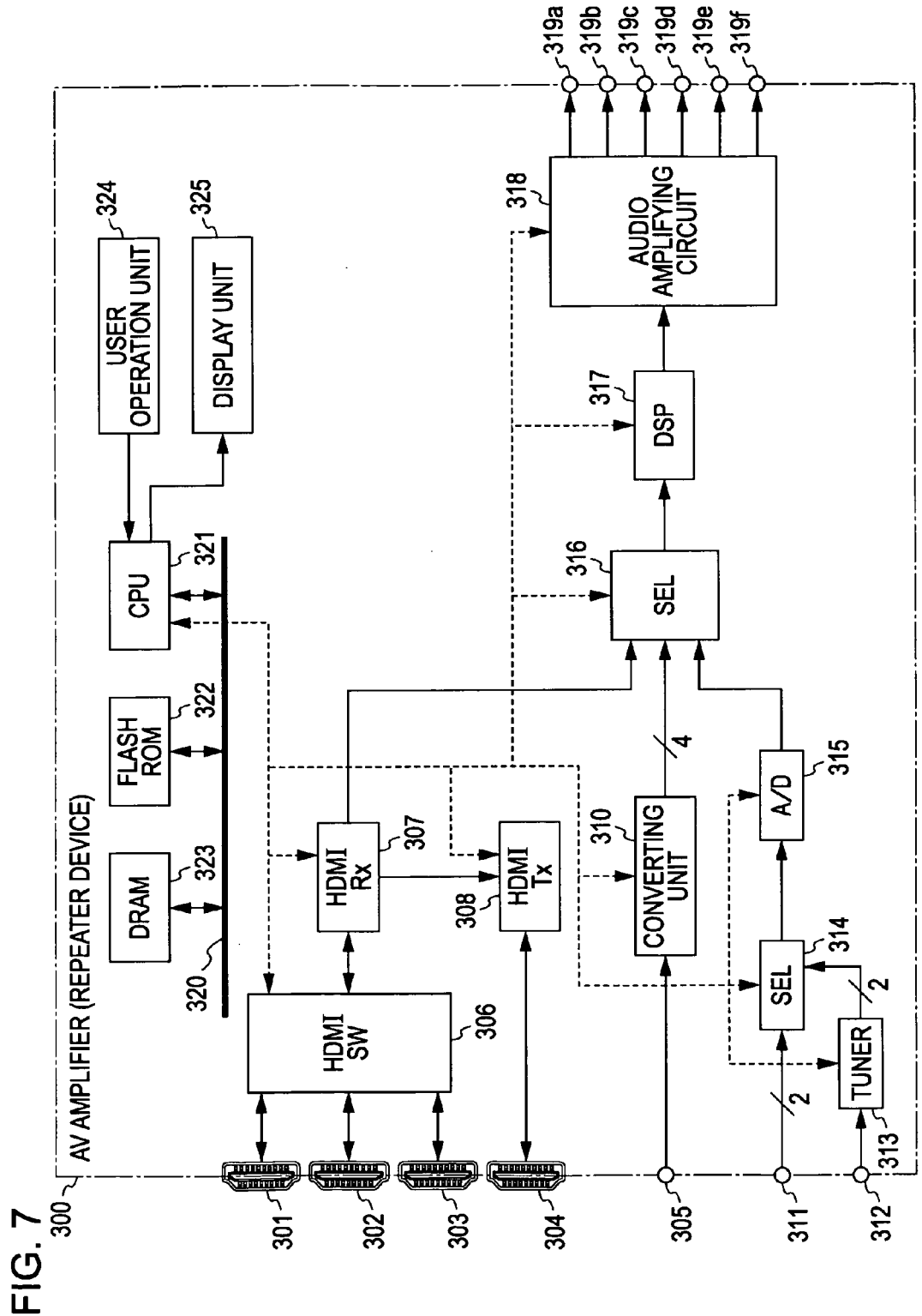
FIG. 7 is a block diagram illustrating an example of the configuration of an AV amplifier (repeater device) included in the AV system.

FIG. 7 illustrates an example of the configuration of the AV amplifier 300. The AV amplifier 300 includes the HDMI terminals 301 to 304, a light input terminal 305, an HDMI switcher 306, an HDMI receiving unit 307, an HDMI transmitting unit 308, a converting unit 310, an analog audio input terminal 311, an antenna terminal 312, an FM tuner 313, a selector 314, an A/D converter 315, a selector 316, a DSP (Digital Signal Processor) 317, an audio amplifying circuit 318, audio output terminals 319*a* to 319*f*, an internal bus 320, a CPU 321, a flash ROM 322, and a DRAM 323.

Here, the HDMI switcher 306 and the selectors 314 and 316 constitute an audio input selecting unit. The DSP 317 constitutes a signal processing unit. The audio amplifying circuit 318 constitutes a signal output unit. The CPU 321 constitutes a sound field control unit, an output control unit, and a genre information requesting unit.

The CPU 321 controls operations of the respective units of the AV amplifier 300. The flash ROM 322 stores control software and data. The DRAM 323 serves as a work area of the CPU 321. The CPU 321 expands the software and data read from the flash ROM 322 on the DRAM 323 and starts the software, so as to control the respective units of the AV amplifier 300. The CPU 321, the flash ROM 322, and the DRAM 323 connect to the internal bus 320.

The CPU 321 connects to a user operation unit 324 and a display unit 325. The use operation unit 324 and the display unit 325 constitute a user interface. The user can select output voice of the AV amplifier 300 and perform tuning and operation setting of the FM tuner 313 by using the user operation unit 324. Also, the user can set ON/OFF of the genre-linked mode and ON/OFF of the system audio mode by using the user operation unit 324. In this point of view, the user operation unit 324 constitutes a mode setting unit.

The user operation unit 324 includes a key, a button, a dial, and a remote control transmitter/receiver that are placed on a casing (not illustrated) of the AV amplifier 300. The display unit 325 displays an operation status of the AV amplifier 300 and an operation status of the user and includes an LCD (Liquid Crystal Display) or the like.

The light input terminal 305 is a terminal to input digital light signals of the S/PDIF standard through an optical cable. The converting unit 310 generates, from the digital light signals input to the light input terminal 305, a clock LRCK having a frequency (e.g., 44.1 kHz) that is the same as the sampling frequency of audio signals, a master clock MCK having a frequency 512 times or 256 times the sampling frequency, right and left audio data RDATA and LDATA of 24 bits existing every period of the clock LRCK, and a bit clock BCK synchronizing each bit of the data, and supplies them to the selector 316.

The analog audio input terminal 311 is a terminal to input right and left analog audio signals obtained from an external apparatus. The antenna terminal 312 is a terminal to input FM broadcast signals received by an FM receiving antenna (not illustrated). The FM tuner 313 processes the FM broadcast signals input to the antenna terminal 312 and outputs right and left analog audio signals corresponding to a channel selected by the user. The selector 314 selectively extracts analog audio signals input to the analog audio input terminal 311 or analog audio signals output from the tuner 313. The A/D converter 315 converts the analog audio signals extracted by the selector 314 to digital audio data and supplies the data to the selector 316.

The HDMI switcher 306 selectively connects the HDMI terminals 301 to 313 to the HDMI receiving unit 307. The HDMI receiving unit 307 is selectively connected to any of the HDMI terminals 301 to 303 via the HDMI switcher 306. The HDMI receiving unit 307 receives baseband video and audio data unidirectionally transmitted from an external device (source device) connected to any of the HDMI terminals 301 to 303 by communication compatible with HDMI.

The HDMI receiving unit 307 supplies the audio data to the selector 316 and supplies the video and audio data to the HDMI transmitting unit 308. The HDMI transmitting unit 308 transmits the baseband video and audio data supplied from the HDMI receiving unit 307 from the HDMI terminal 304 by communication compatible with HDMI. Accordingly, the AV amplifier 300 exerts a repeater function. The details of the HDMI receiving unit 307 and the HDMI transmitting unit 308 are described below.

The selector 316 selectively extracts the audio data supplied from the HDMI receiving unit 307, the audio data supplied from the converting unit 310, or the audio data supplied from the A/D converter 315, and supplies the data to the DSP 317.

The DSP 317 processes the audio data obtained from the selector 316 and performs a process of generating audio data of respective channels to realize 5.1 ch surround, a process of giving a predetermined sound field characteristic, a process of converting a digital signal to an analog signal, and so on. The audio amplifying circuit 318 amplifies a front-left audio signal SFL, a front-right audio signal SFR, a front-center audio signal SFC, a rear-left audio signal SRL, a rear-right audio signal SRR, and a subwoofer audio signal Ssw output from the DSP 317 and outputs the amplified signals to the audio output terminals 319*a* to 319*f*.

Although not illustrated in the figure, the audio output terminals 319*a* to 319*f* connect to a front-left speaker, a front-right speaker, a front-center speaker, a rear-left speaker, a rear-right speaker, and a subwoofer speaker that constitute the speaker group 350.

Now, operations of the AV amplifier 300 illustrated in FIG. 7 are briefly described. In the HDMI receiving unit 307, baseband video and audio data input to the HDMI terminals 301 to 303 through HDMI cables can be obtained. The video and audio data is supplied to the HDMI transmitting unit 308 and is output to the HDMI cable connected to the HDMI terminal 304.

Also, the audio data obtained in the HDMI receiving unit 307 is supplied to the selector 316. In the selector 316, audio data supplied from the HDMI receiving unit 307, audio data supplied from the converting unit 310, or audio data supplied from the A/D converter 315 is selectively extracted and is supplied to the DSP 317.

In the DSP 317, necessary processes such as a process of generating audio data of respective channels to realize 5.1 ch surround, a process of giving a predetermined sound field characteristic, and a process of converting a digital signal to an analog signal are performed. The audio signals of the respective channels output from the DSP 317 are supplied to the audio output terminals 319*a* to 319*f* via the audio amplifying circuit 318.

For example, in the AV system 100 illustrated in FIG. 1, the following operations are performed to watch/listen to a program selected by the digital tuner 211 of the television receiver 200 when the AV amplifier 300 is in a system audio mode ON state. That is, in the selector 316, audio data from the converting unit 310 is extracted. Accordingly, audio signals of the respective channels related to audio data of the program selected by the digital tuner 211 of the television receiver 200 are output to the audio output terminals 319a to 319f. As a result, voices of the program selected by the digital tuner 211 of the television receiver 200 are output from the speaker group 350 connected to the AV amplifier 300.

Here, when the AV amplifier 300 is in a genre-linked mode ON state, a sound field characteristic corresponding to the genre information supplied from the television receiver 200 through the CEC line is given to the audio data extracted by the selector 316 in the DSP 317. Accordingly, the voices output from the speaker group 350 connected to the AV amplifier 300 have the sound field characteristic corresponding to the genre of the program selected by the digital tuner 211 of the television receiver 200.

In the case where a program selected by the digital tuner 211 of the television receiver 200 is watched/listened to and where the AV amplifier 300 is in a system audio mode OFF state, the audio amplifying circuit 318 is brought into a muting state, so that audio signals are not supplied from the audio amplifying circuit 318 to the audio output terminals 319a to 319f.

For example, in the AV system 100 illustrated in FIG. 1, the following operations are performed to watch/listen to images and voices based on video data and audio data from the BD recorder 400 when the AV amplifier 300 is in a system audio mode ON state. That is, the HDMI terminal 301 is connected to the HDMI receiving unit 307 by the HDMI switcher 306. The selector 316 extracts the audio data from the HDMI receiving unit 307. Accordingly, audio signals of the respective channels related to the audio data from the BD recorder 400 are output to the audio output terminals 319a to 319f. As a result, voices based on the audio data from the BD recorder 400 are output from the speaker group 350 connected to the AV amplifier 300.

Here, when the AV amplifier 300 is in a genre-linked mode ON state, a sound field characteristic corresponding to the genre information supplied from the BD recorder 400 through the CEC line is given to the audio data extracted by the selector 316 in the DSP 317. Accordingly, the voices output from the speaker group 350 connected to the AV amplifier 300 have the sound field characteristic corresponding to the genre of the program selected by the digital tuner 411 of the BD recorder 400 or the type of content played back from a disc in the BD recorder 400.

In the case where images and voices based on video data and audio data from the BD recorder 400 are watched/listened to and where the AV amplifier 300 is in a system audio mode OFF state, the audio amplifying circuit 318 is brought into a muting state, so that audio signals are not supplied from the audio amplifying circuit 318 to the audio output terminals 319a to 319f.

For example, in the AV system 100 illustrated in FIG. 1, the following operations are performed to watch/listen to images and voices based on video data and audio data from the DVD player 500 when the AV amplifier 300 is in a system audio mode ON state. That is, the HDMI terminal 302 is connected to the HDMI receiving unit 307 by the HDMI switcher 306. The selector 316 extracts the audio data from the HDMI receiving unit 307. Accordingly, audio signals of the respective channels related to the audio data from the DVD player 500 are output to the audio output terminals 319a to 319f. As a result, voices based on the audio data from the DVD player 500 are output from the speaker group 350 connected to the AV amplifier 300.

Here, when the AV amplifier 300 is in a genre-linked mode ON state, a sound field characteristic corresponding to the genre information supplied from the DVD player 500 through the CEC line is given to the audio data extracted by the selector 316 in the DSP 317. Accordingly, the voices output from the speaker group 350 connected to the AV amplifier 300 have the sound field characteristic corresponding to the type of content played back from a disc in the DVD player 500.

In the case where images and voices based on the video data and audio data from the DVD player 500 are watched/listened to and where the AV amplifier 300 is in a system audio mode OFF state, the audio amplifying circuit 318 is brought into a muting state, so that audio signals are not supplied from the audio amplifying circuit 318 to the audio output terminals 319a to 319f.

For example, in the AV system 100 illustrated in FIG. 1, the following operations are performed to watch/listen to images and voices based on video data and audio data from the DVD recorder 600 when the AV amplifier 300 is in a system audio mode ON state. That is, the HDMI terminal 303 is connected to the HDMI receiving unit 307 by the HDMI switcher 306. The selector 316 extracts the audio data from the HDMI receiving unit 307. Accordingly, audio signals of the respective channels related to the audio data from the DVD recorder 600 are output to the audio output terminals 319a to 319f. As a result, voices based on the audio data from the DVD recorder 600 are output from the speaker group 350 connected to the AV amplifier 300.

In this case, since the DVD recorder 600 is incompatible with CEC, genre information is not supplied from the DVD recorder 600 through the CEC line even if the AV amplifier 300 is in a genre-linked mode ON state. Therefore, in the DSP 317, a sound field characteristic "standard" is given to the audio data extracted by the selector 316. That is, no particular audio processing is performed.

When audio data supplied from the A/D converter 315 is extracted by the selector 316 and when voices based on analog audio signals input to the analog audio input terminal 311 are output or when voices based on audio data obtained in the FM tuner 313 are output, the following operations are performed.

That is, in the selector 316, audio data from the A/D converter 315 is extracted. Accordingly, voices based on analog audio signals or FM audio signal are output from the speaker group 350 connected to the audio output terminals 319a to 319f. In this case, in the DSP 317, a sound field characteristic "standard" is given to the audio data extracted by the selector 316. That is, no particular audio processing is performed.

Figure 8:
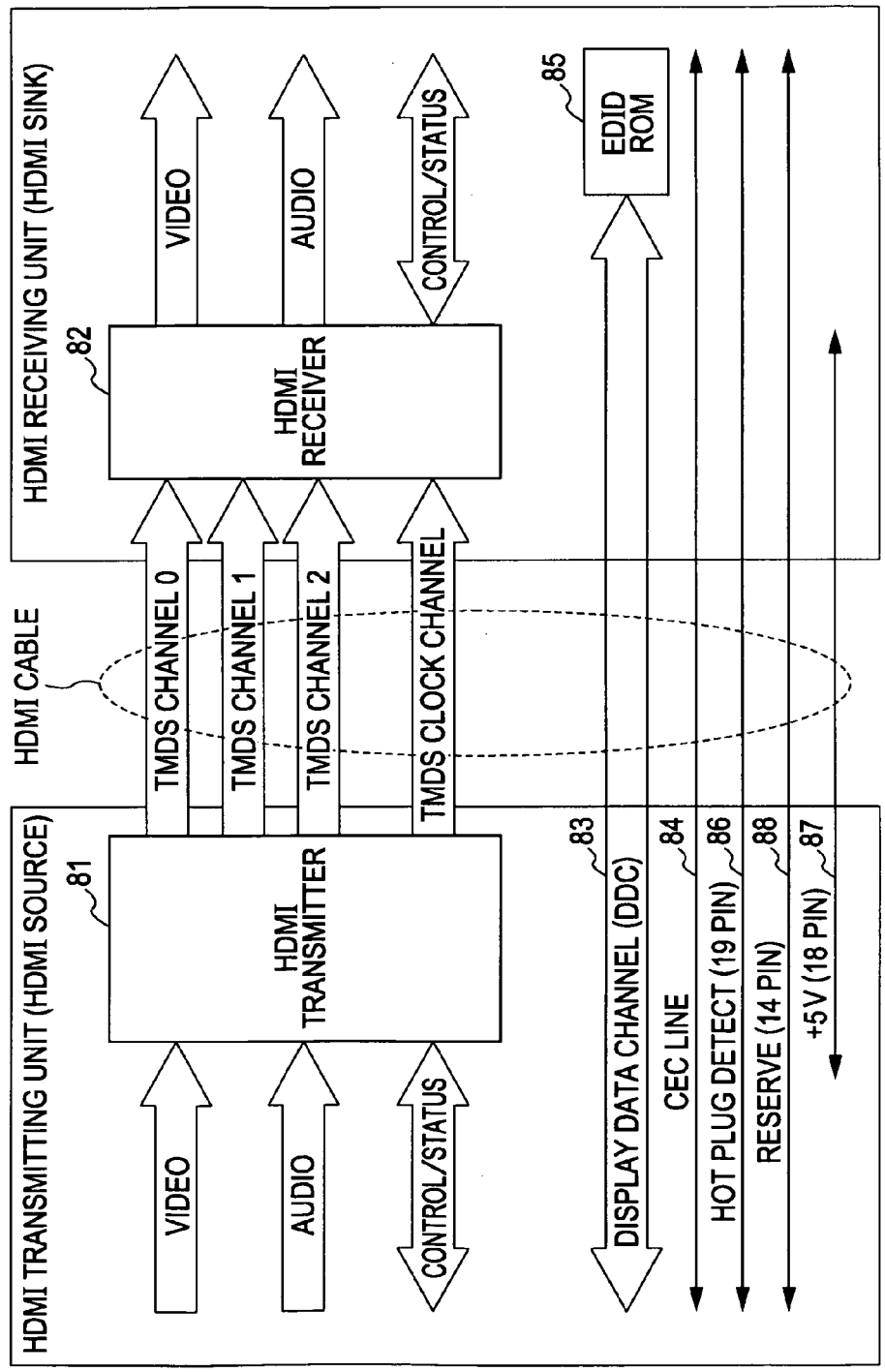
FIG. 8 is a block diagram illustrating an example of the configuration of an HDMI transmitting unit (HDMI source) and an HDMI receiving unit (HDMI sink)

FIG. 8 illustrates an example of the configuration of the HDMI transmitting unit (HDMI transmitting unit 308 and HDMI transmitting unit 402) and the HDMI receiving unit (HDMI receiving unit 205 and HDMI receiving unit 307).

The HDMI transmitting unit (HDMI source) unidirectionally transmits differential signals corresponding to uncompressed pixel data of an image of one screen to the HDMI receiving unit (HDMI sink) through a plurality of channels in an effective image period (hereinafter also referred to as an active video period), which is a period from one vertical synchronization signal to the next vertical synchronization signal except a horizontal blanking period and a vertical blanking period. Also, the HDMI transmitting unit unidirectionally transmits differential signals corresponding to at least audio data attached to the image, control data, and other auxiliary data to the HDMI receiving unit through a plurality of channels in the horizontal blanking period or the vertical blanking period.

More specifically, the HDMI transmitting unit includes an HDMI transmitter 81. The HDMI transmitter 81 converts uncompressed pixel data of an image to a corresponding differential signals and unidirectionally transmits the signals in serial to the HDMI receiving unit connected through the HDMI cable through a plurality of channels: three TMDS channels #0, #1, and #2.

Also, the HDMI transmitter 81 converts audio data attached to the uncompressed image, necessary control data, and other auxiliary data to corresponding differential signals and unidirectionally transmits the signals in serial to the HDMI receiving unit connected through the HDMI cable through the three TMDS channels #0, #1, and #2.

Furthermore, the HDMI transmitter 81 transmits a pixel clock synchronizing to the pixel data transmitted through the three TMDS channels #0, #1, and #2 to the HDMI receiving unit connected through the HDMI cable through a TMDS clock channel. Here, in each TMDS channel #i (i=0, 1, 2), 10 bits of pixel data is transmitted in one clock of the pixel clock.

The HDMI receiving unit receives the differential signals corresponding to the pixel data unidirectionally transmitted from the HDMI transmitting unit through the plurality of channels in the active video period. Also, the HDMI receiving unit receives the differential signals corresponding to the audio data and control data unidirectionally transmitted from the HDMI transmitting unit through the plurality of channels in the horizontal blanking period of the vertical blanking period.

Specifically, the HDMI receiving unit includes an HDMI receiver 82. The HDMI receiver 82 receives the differential signals corresponding to the pixel data and the differential signals corresponding to the audio data and control data unidirectionally transmitted through the TMDS channels #0, #1, and #2 from the HDMI transmitting unit connected through the HDMI cable, in synchronization with the pixel clock transmitted from the HDMI transmitting unit through the TMDS clock channel.

Transmission channels provided in an HDMI system including the HDMI transmitting unit and the HDMI receiving unit include the three TMDS channels #0 to #2 serving as transmission channels to unidirectionally transmit pixel data and audio data in serial from the HDMI transmitting unit to the HDMI receiving unit in synchronization with a pixel clock; the TMDS clock channel serving as a transmission channel to transmit a pixel clock; and transmission channels called a DDC (Display Data Channel) 83 and a CEC line 84.

The DDC 83 includes two signal lines (not illustrated) included in the HDMI cable and is used by the HDMI transmitting unit to read E-EDID (Enhanced Extended Display Identification Data) from the HDMI receiving unit connected through the HDMI cable.

That is, the HDMI receiving unit includes, in addition to the HDMI receiver 82, an EDID ROM (Read Only Memory) 85 storing E-EDID, which is performance information about its performance (configuration/capability). The HDMI transmitting unit reads the E-EDID of the HDMI receiving unit from the HDMI receiving unit connected through the HDMI cable through the DDC 83, and recognizes the format (profile) of images compatible with an electronic device including the HDMI receiving unit, e.g., RGB, YCbCr 4:4:4, or YCbCr 4:2:2, on the basis of the E-EDID.

The CEC line 84 includes a signal line (not illustrated) included in the HDMI cable and is used for bidirectional communication of control data between the HDMI transmitting unit and the HDMI receiving unit.

The HDMI cable includes a line 86 connected to a pin called HPD (Hot Plug Detect). The source device can detect connection of the sink device by using the line 86. Also, the HDMI cable includes a line 87 used to supply power from the source device to the sink device. Furthermore, the HDMI cable includes a reserve line 88.

Figure 9:
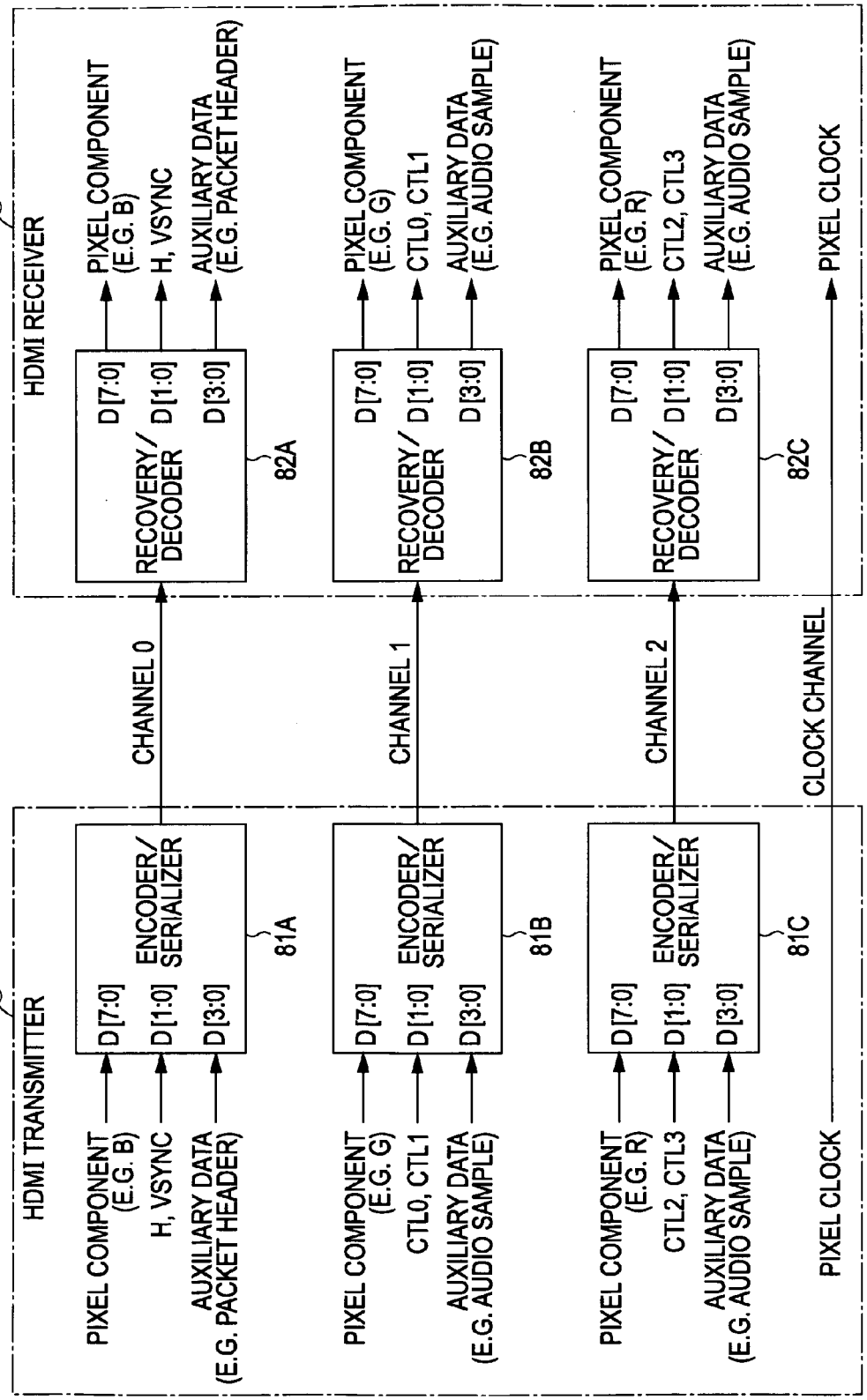
FIG. 9 is a block diagram illustrating an example of the configuration of an HDMI transmitter and an HDMI receiver.

FIG. 9 illustrates an example of the configuration of the HDMI transmitter 81 and the HDMI receiver 82 illustrated in FIG. 8.

The HDMI transmitter 81 includes three encoders/serializers 81A, 81B, and 81C corresponding to the three TMDS channels #0, #1, and #2, respectively. The respective encoders/serializers 81A, 81B, and 81C encode image data, auxiliary data, and control data supplied thereto, convert parallel data to serial data, and transmit the serial data by using differential signals.

Now, assume that the image data has three components of R (red), G (green), and B (blue). In this case, B component is supplied to the encoder/serializer 81A, G component is supplied to the encoder/serializer 81B, and R component is supplied to the encoder/serializer 81C.

The auxiliary data includes audio data and a control packet. The control packet is supplied to the encoder/serializer 81A, and the audio data is supplied to the encoders/serializers 81B and 81C, for example.

Furthermore, the control data includes a 1-bit vertical synchronization signal (VSYNC), a 1-bit horizontal synchronization signal (HSYNC), and control bits CTL0, CTL1, CTL2, and CTL3 each having 1 bit. The vertical and horizontal synchronization signals are supplied to the encoder/serializer 81A. The control bits CTL0 and CTL1 are supplied to the encoder/serializer 81B, and the control bits CTL2 and CTL3 are supplied to the encoder/serializer 81C.

The encoder/serializer 81A transmits B component of image data, vertical and horizontal synchronization signals, and auxiliary data supplied thereto in a time-division method. That is, the encoder/serializer 81A converts B component of image data supplied thereto to parallel data in units of 8 bits of a fixed bit number. Furthermore, the encoder/serializer 81A encodes the parallel data, converts the parallel data to serial data, and transmits the serial data through the TMDS channel #0.

Also, the encoder/serializer 81A encodes 2-bit parallel data of the vertical and horizontal synchronization signals supplied thereto, converts the parallel data to serial data, and transmits the serial data through the TMDS channel #0. Furthermore, the encoder/serializer 81A converts the auxiliary data supplied thereto to parallel data in units of 4 bits. Then, the encoder/serializer 81A encodes the parallel data, converts the parallel data to serial data, and transmits the serial data through the TMDS channel #0.

The encoder/serializer 81B transmits G component of image data, control bits CTL0 and CTL1, and auxiliary data supplied thereto in a time-division method. That is, the encoder/serializer 81B converts G component of image data supplied thereto to parallel data in units of 8 bits of a fixed bit number. Furthermore, the encoder/serializer 81B encodes the parallel data, converts the parallel data to serial data, and transmits the serial data through the TMDS channel #1.

Also, the encoder/serializer 81B encodes 2-bit parallel data of the control bits CTL0 and CTL1 supplied thereto, converts the parallel data to serial data, and transmits the serial data through the TMDS channel #1. Furthermore, the encoder/serializer 81B converts the auxiliary data supplied thereto to parallel data in units of 4 bits. Then, the encoder/serializer 81B encodes the parallel data, converts the parallel data to serial data, and transmits the serial data through the TMDS channel #1.

The encoder/serializer 81C transmits R component of image data, control bits CTL2 and CTL3, and auxiliary data supplied thereto in a time-division method. That is, the encoder/serializer 81C converts R component of image data supplied thereto to parallel data in units of 8 bits of a fixed bit number. Furthermore, the encoder/serializer 81C encodes the parallel data, converts the parallel data to serial data, and transmits the serial data through the TMDS channel #2.

Also, the encoder/serializer 81C encodes 2-bit parallel data of the control bits CTL2 and CTL3 supplied thereto, converts the parallel data to serial data, and transmits the serial data through the TMDS channel #2. Furthermore, the encoder/serializer 81C converts the auxiliary data supplied thereto to parallel data in units of 4 bits. Then, the encoder/serializer 81C encodes the parallel data, converts the parallel data to serial data, and transmits the serial data through the TMDS channel #2.

The HDMI receiver 82 includes three recovery/decoders 82A, 82B, and 82C corresponding to the three TMDS channels #0, #1, and #2. The respective recovery/decoders 82A, 82B, and 82C receive image data, auxiliary data, and control data transmitted by differential signals through the TMDS channels #0, #1, and #2. Furthermore, the respective recovery/decoders 82A, 82B, and 82C convert the image data, auxiliary data, and control data from serial data to parallel data, decode the parallel data, and output the parallel data.

That is, the recovery/decoder 82A receives B component of image data, vertical and horizontal synchronization signals, and auxiliary data transmitted by differential signals through the TMDS channel #0. Then, the recovery/decoder 82A converts the B component of image data, the vertical and horizontal synchronization signals, and the auxiliary data from serial data to parallel data, decodes the parallel data, and outputs the parallel data.

The recovery/decoder 82B receives G component of image data, control bits CTL0 and CTL1, and auxiliary data transmitted by differential signals through the TMDS channel #1. Then, the recovery/decoder 82B converts the G component of image data, the control bits CTL0 and CTL1, and the auxiliary data from serial data to parallel data, decodes the parallel data, and outputs the parallel data.

The recovery/decoder 82C receives R component of image data, control bits CTL2 and CTL3, and auxiliary data transmitted by differential signals through the TMDS channel #2. Then, the recovery/decoder 82C converts the R component of image data, the control bits CTL2 and CTL3, and the auxiliary data from serial data to parallel data, decodes the parallel data, and outputs the parallel data.

Figure 10:
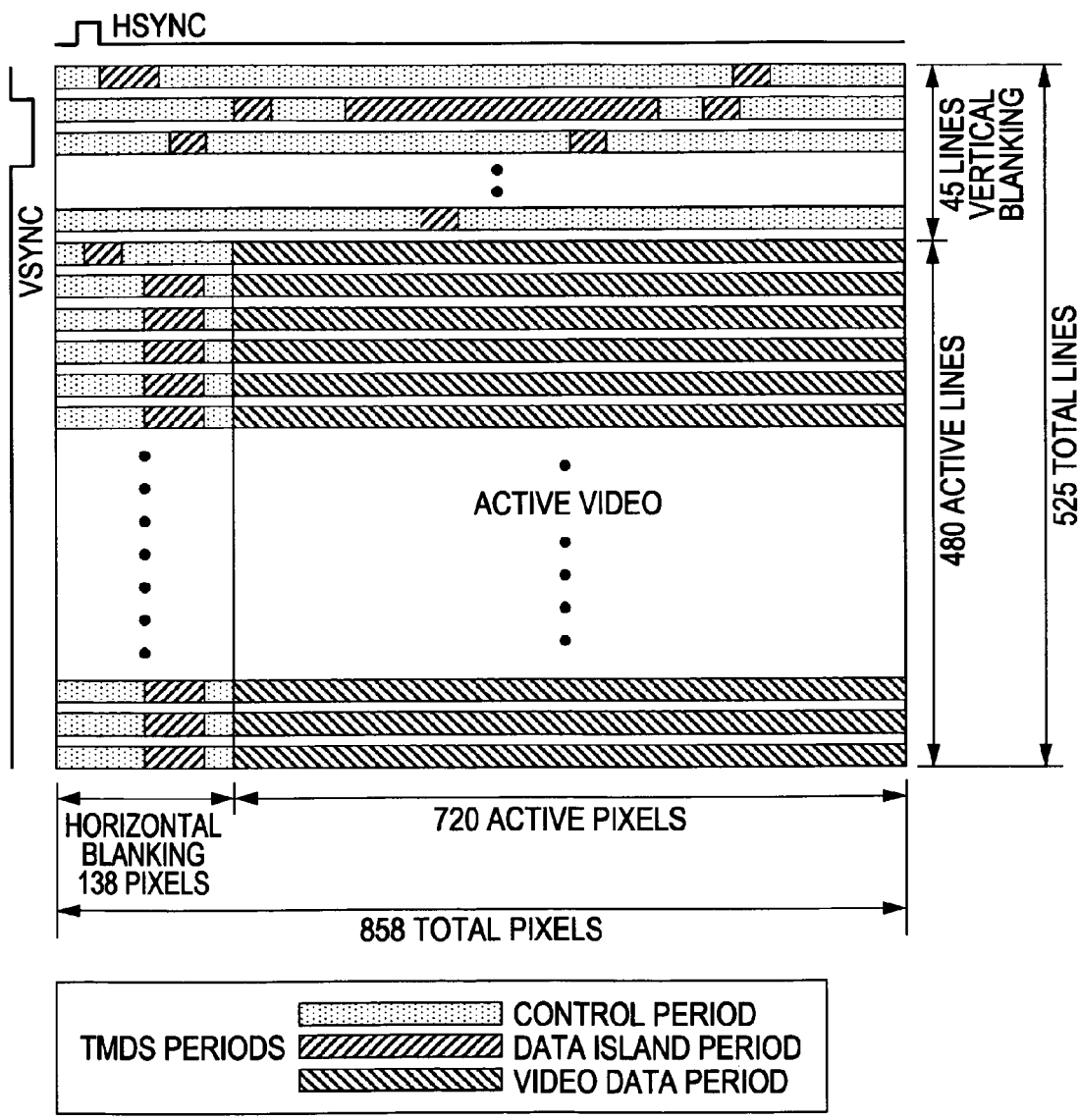
FIG. 10 illustrates a structure of TMDS transmission data.

FIG. 10 illustrates an example of transmission periods in which various pieces of transmission data are transmitted through the three TMDS channels #0, #1, and #2 of HDMI. FIG. 10 illustrates the periods of respective pieces of transmission data in the case where progressive images of horizontal 720×vertical 480 pixels are transmitted through the TMDS channels #0, #1, and #2.

In a video field where transmission data is transmitted through the three TMDS channels #0, #1, and #2 of HDMI, three types of periods exist according to the types of transmission data: a video data period, a data island period, and a control period.

The video field period is a period from an active edge of a vertical synchronization signal to an active edge of the next vertical synchronization signal, and includes a horizontal blanking period, a vertical blanking period, and an active video period, which is the video field period except the horizontal blanking period and the vertical blanking period.

The video data period is assigned to the active video period. In the video data period, data of active pixels corresponding to 720 pixels×480 lines constituting uncompressed image data of one screen is transmitted.

The data island period and the control period are assigned to the horizontal blanking period and the vertical blanking period. In the data island period and the control period, auxiliary data is transmitted.

Specifically, the data island period is assigned to part of the horizontal blanking period and the vertical blanking period. In the data island period, data unrelated to control in the auxiliary data, for example, packets of audio data, are transmitted.

The control period is assigned to the other part of the horizontal blanking period and the vertical blanking period. In the control period, data related to control in the auxiliary data, for example, vertical and horizontal synchronization signals and control packets, are transmitted.

In the current HDMI, the frequency of a pixel clock transmitted through the TMDS clock channel is 165 MHz, for example. In this case, the transmission rate in the data island period is about 500 Mbps.

FIG. 11 illustrates a pin array of HDMI terminals. This pin array is an example of type A.

Two lines serving as differential lines through which differential signals TMDS Data #i+ and TMDS Data #i− of the TMDS channel #i are transmitted connect to the pins to which TMDS Data #i+ is assigned (pins having pin numbers 1, 4, and 7) and the pins to which TMDS Data #i− is assigned (pins having pin numbers 3, 6, and 9).

The CEC line 84 through which a CEC signal as controlling data is transmitted connects to the pin having a pin number 13. The pin having a pin number 14 is reserved. The line through which an SDA (serial data) signal such as E-EDID is transmitted connects to the pin having a pin number 16. The line through which an SCL (serial clock) signal as a clock signal used for synchronization at transmission/reception of an SDA signal connects to the pin having a pin number 15. The above-described DDC 83 includes the line through which the SDA signal is transmitted and the line through which the SCL signal is transmitted.

As described above, the line 86 used by a source device to detect connection of a sink device connects to the pin having a pin number 19. Also, as described above, the line 87 to supply power connects to the pin having a pin number 18.

Figure 12:
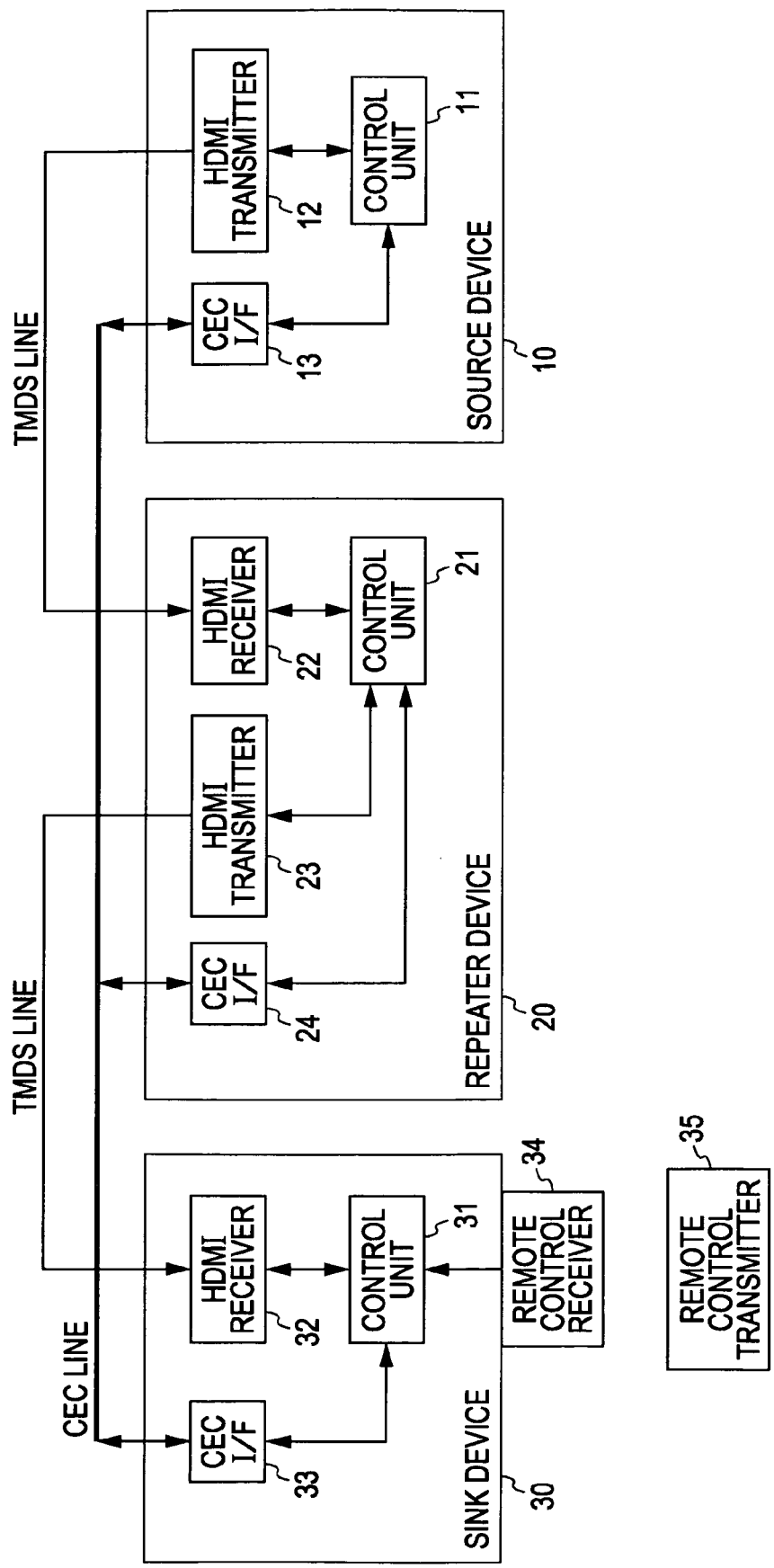
FIG. 12 illustrates an example of the configuration of a main part related to HDMI connection in the case where a source device, a repeater device, and a sink device are connected through HDMI cables.

FIG. 12 illustrates an example of the configuration of a main part in the case where a source device 10, a repeater device 20, and a sink device 30 are mutually connected through HDMI cables.

The HDMI cables include TMDS lines to transmit video and audio data in a differential method and a CEC line serving as a bidirectional bus to transmit a common control signal (CEC message) between devices.

The source device 10 corresponds to the BD recorder 400 and the DVD player 500 in the AV system illustrated in FIG. 1, for example. The source device 10 includes a control unit 11, an HDMI transmitter 12, and a CEC interface 13. Here, the control unit 11 corresponds to the CPU 421, the flash ROM 422, and the DRAM 423 of the BD recorder 400 illustrated in FIG. 6, for example. The HDMI transmitter 12 and the CEC interface 13 correspond to the HDMI transmitting unit 402 of the BD recorder 400 illustrated in FIG. 6, for example.

The repeater device 20 corresponds to the AV amplifier 300 of the AV system 100 illustrated in FIG. 1, for example. The repeater device 20 includes a control unit 21, an HDMI receiver 22, an HDMI transmitter 23, and a CEC interface 24. Here, the control unit 21 corresponds to the CPU 321, the flash ROM 322, and the DRAM 323 of the AV amplifier 300 illustrated in FIG. 7, for example. The HDMI receiver 22, the HDMI transmitter 23, and the CEC interface 24 correspond to the HDMI receiving unit 307 and the HDMI transmitting unit 308 of the AV amplifier 300 illustrated in FIG. 7, for example.

The sink device 30 corresponds to the television receiver 200 of the AV system 100 illustrated in FIG. 1, for example. The sink device 30 includes a control unit 31, an HDMI receiver 32, a CEC interface 33, a remote control receiver 34, and a remote control transmitter 35. Here, the control unit 31 corresponds to the CPU 231, the flash ROM 232, and the DRAM 233 of the television receiver 200 illustrated in FIG. 5, for example.

The HDMI receiver 32 and the CEC interface 33 correspond to the HDMI receiving unit 205 of the television receiver 200 illustrated in FIG. 5, for example. The remote control receiver 34 and the remote control transmitter 35 correspond to the remote control receiver 234 and the remote control transmitter 235 of the television receiver 200 illustrated in FIG. 5.

The HDMI transmitter 12 of the source device 10 and the HDMI receiver 22 of the repeater device 20 connect to each other through a TMDS line. Also, the HDMI transmitter 23 of the repeater device 20 and the HDMI receiver 32 of the sink device 30 connect to each other through a TMDS line. Also, the CEC interfaces 13, 24, and 33 of the source device 10, the repeater device 20, and the sink device 30 are mutually connected through a CEC line. In this way, since the source device 10, the repeater device 20, and the sink device 30 are mutually connected through the CEC line, the repeater device 20 and the source device 10 can be operated by the remote control transmitter 35 of the sink device 30 through the CEC line.

Figure 13:
FIG. 13 illustrates a block structure of data transmitted through a CEC line (CEC channel)
Figure 14:
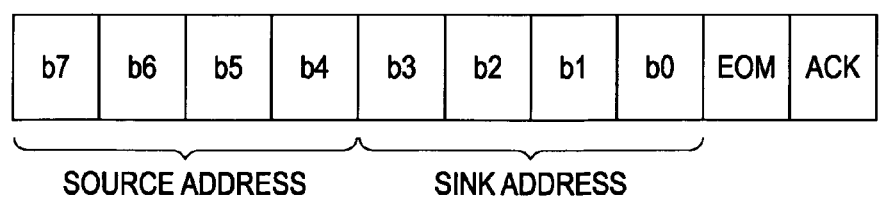
FIG. 14 illustrates an example of a data structure of a header block.

FIG. 13 illustrates a block structure of data transmitted through the CEC line (CEC channel). In the CEC line, one block is transmitted in 4.5 milliseconds. At start of data transmission, a start bit is placed, a header block is placed, and then an arbitrary number (n) of data blocks including data to be actually transmitted are placed. FIG. 14 illustrates an example of data structure of the header block. In the header block, a logical address of the source (source address) and a logical address of the sink (sink address) are placed.

Hereinafter, various examples of operations of the CPU 321 of the AV amplifier 300 are described.

Figure 15:
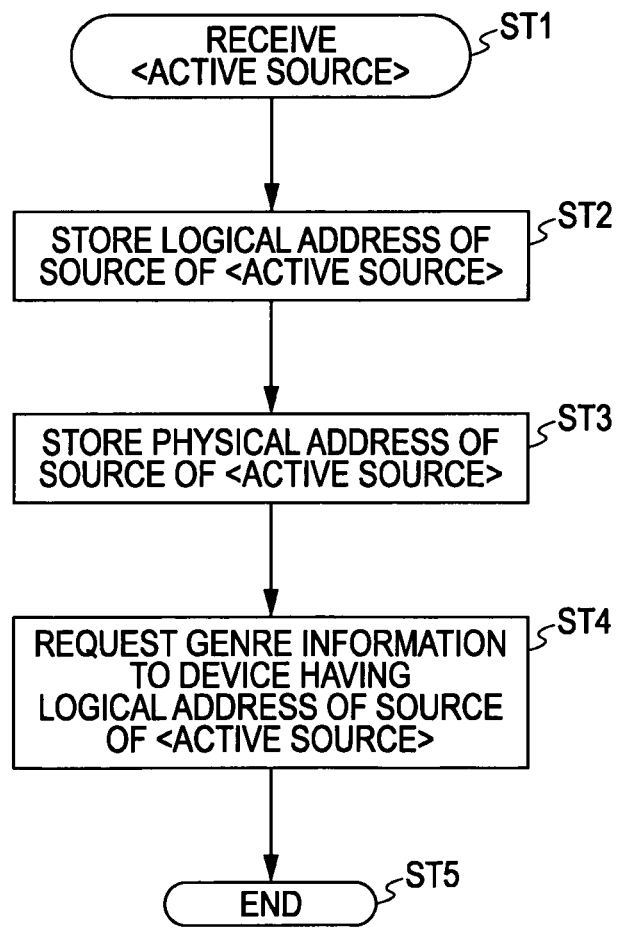
FIG. 15 is a flowchart illustrating an example of operations performed when an <Active Source> message is received.

The flowchart in FIG. 15 illustrates an example of operations performed when an <Active Source> message is received. The CPU 321 receives the <Active Source> message through the CEC line in step ST1, and then the process proceeds to step ST2. In step ST2, the CPU 321 stores a logical address of the source of the <Active Source> message in the DRAM 323, for example.

Then, in step ST3, the CPU 321 stores a physical address of the source of the <Active Source> message in the DRAM 323, for example. Then, in step ST4, the CPU 321 requests genre information to the device having the logical address of the source of the <Active Source> message. In the request for genre information, "Vendor Specific Command", which is a code unique to a device manufacturer set by the CEC standard, is used.

After step ST4, the CPU 321 ends the process in step ST5.

Figure 16:
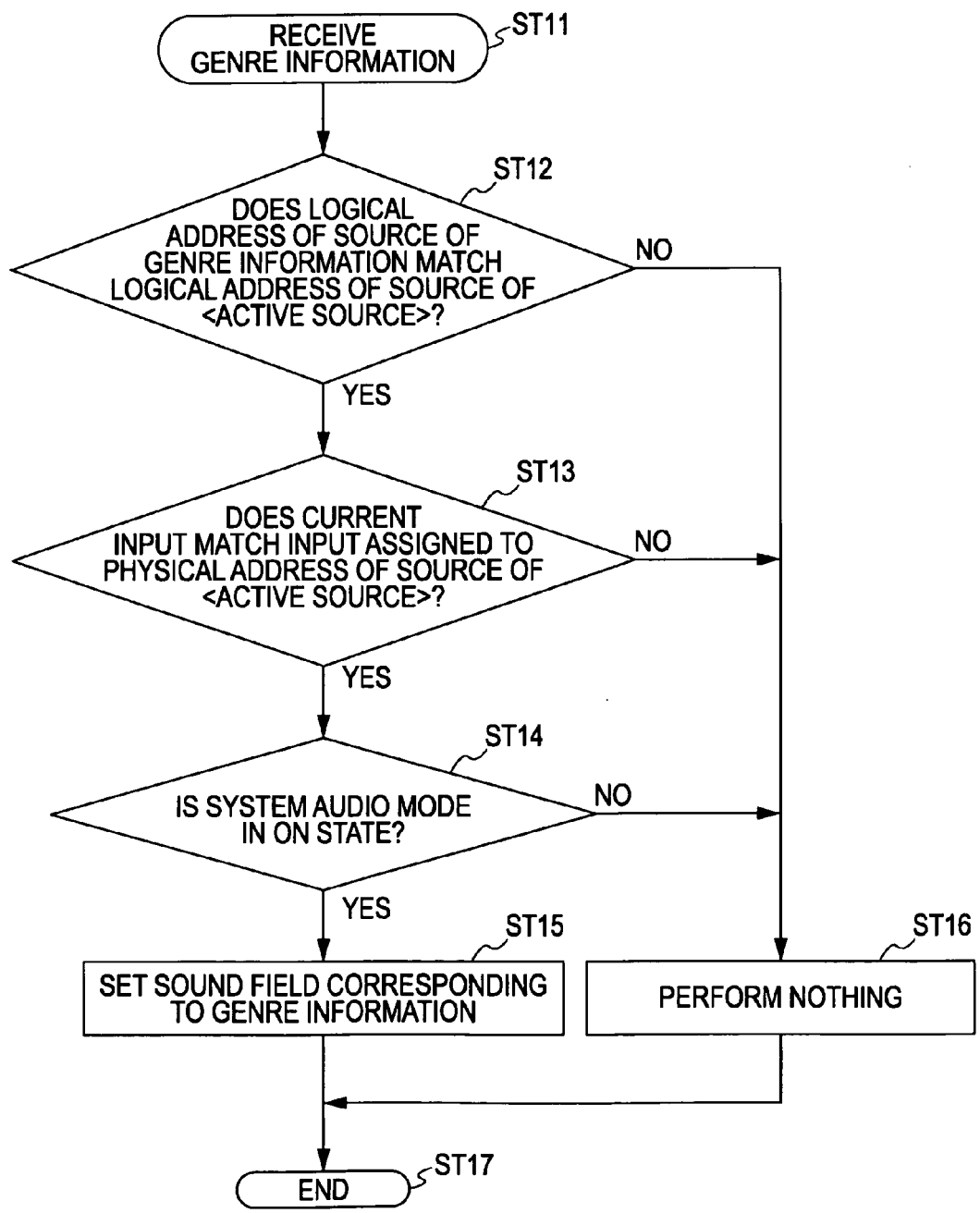
FIG. 16 is a flowchart illustrating an example of operations performed when genre information is received.

The flowchart in FIG. 16 illustrates an example of operations performed when genre information is received. The CPU 321 receives genre information in step ST11, and the process proceeds to step ST12. In step ST12, the CPU 321 determines whether the logical address of the source of the genre information matches the logical address of the source of the <Active Source> message stored in the DRAM 323.

If the logical addresses match, the process proceeds to step ST13, where the CPU 321 determines whether a current input, i.e., an audio input selected by the selector 316 matches an audio input assigned to the physical address of the source of the <Active Source> message stored in the DRAM 323. In the AV amplifier 300, the correspondence between physical addresses and audio inputs is stored in the flash ROM 322 when the respective devices are connected and the AV system 100 illustrated in FIG. 1 is constituted.

If the audio inputs match, the process proceeds to step ST14, where the CPU 321 determines whether the system audio mode is in an ON state. If the system audio mode is in an ON state, the process proceeds to step ST15, where the CPU 321 sets a sound field corresponding to the received genre information. Specifically, the CPU 321 controls the DSP 317 so as to give a sound field characteristic corresponding to the genre information to the audio signals output from the selector 316.

The setting of ON/OFF of the system audio mode is made by a user's operation of the user operation unit 324, as described above. The setting is made based on setting information when the HDMI transmitting unit 308 receives the setting information from the television receiver 200 through the CEC line. In this point of view, the HDMI transmitting unit 308 constitutes a setting information receiving unit.

After step ST15, the CPU 321 ends the process in step ST17.

If it is determined in step ST12 that the logical addresses do not match, if it is determined in step ST13 that the audio inputs do not match, or if it is determined in step ST14 that the system audio mode is not in an ON state, the process proceeds to step ST16, where the CPU 321 performs nothing. Then, the process ends in step ST17.

If the system audio mode is in an OFF state, the AV amplifier 300 is brought into a muting state in an ordinary case. Thus, no problem arises even if the received genre information is immediately reflected on setting of a sound field without determination in step ST14. However, when the sound field changes, the mode may be displayed in the display unit 325 in an ordinary case. Thus, wasteful display can be avoided by performing the determination in step ST14.

Figure 17:
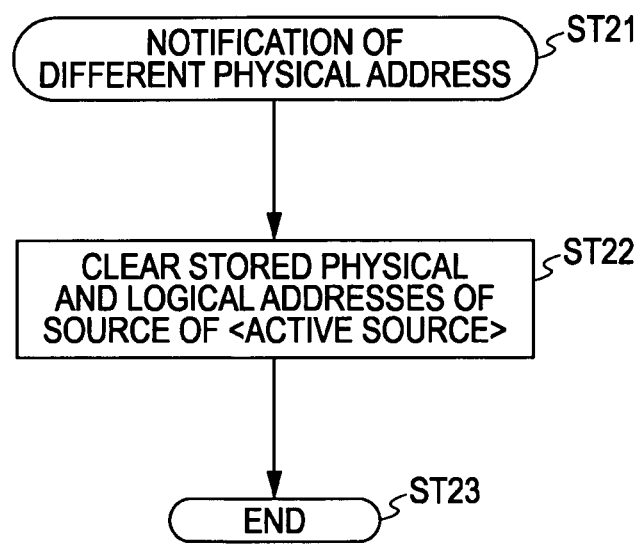
FIG. 17 is a flowchart illustrating an example of operations performed when notification of a physical address different from a physical address of a source of an <Active Source> message stored in a DRAM is received.

The flowchart in FIG. 17 illustrates an example of operations performed when notification of a physical address different from the physical address of the source of the <Active Source> message stored in the DRAM 323 is received. The notification of the physical address is made by a <Routing Change> message, a <Set Stream Path> message, a <Routing Information> message, or the like.

The CPU 321 receives notification of a different physical address in step ST21, and the process proceeds to step ST22. In step ST22, the CPU 321 clears the logical address and physical address of the source of the <Active Source> message stored in the DRAM 323. Then, the process ends in step ST23.

Figure 18:
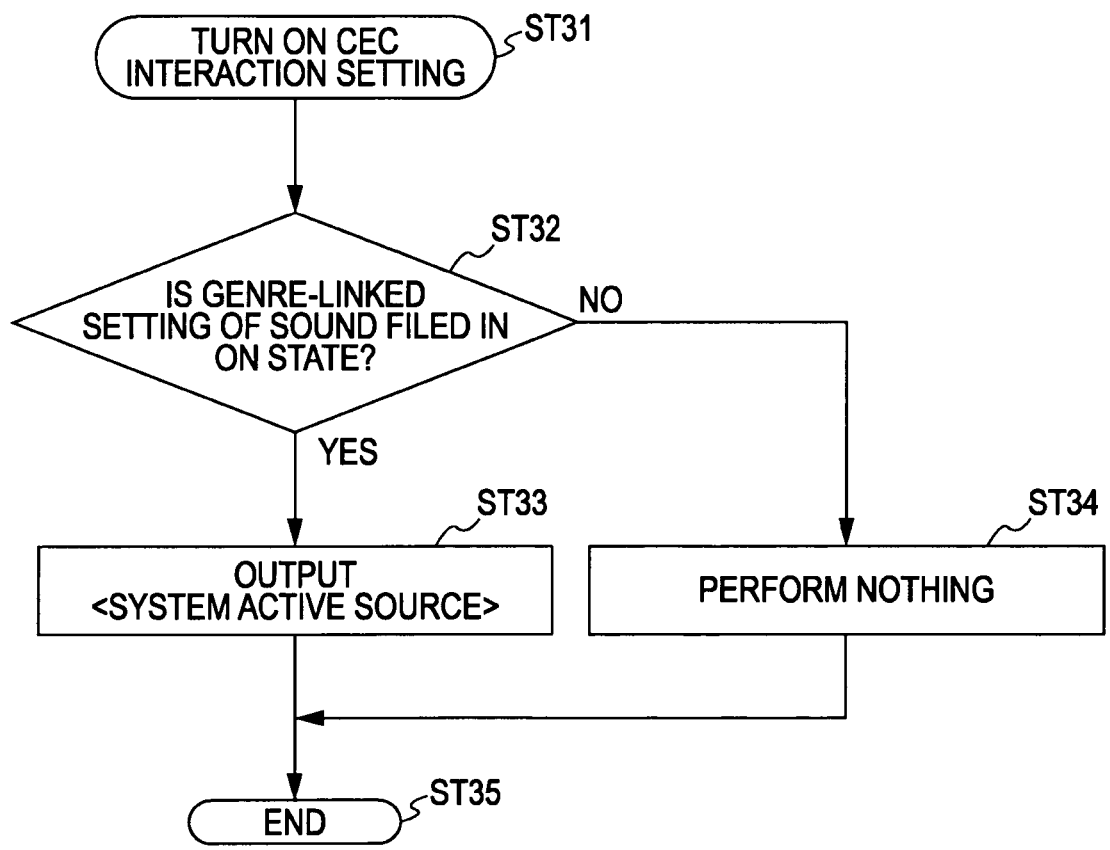
FIG. 18 is a flowchart illustrating an example of operations performed when CEC interaction setting is changed from an OFF state to an ON state.

The flowchart in FIG. 18 illustrates an example of operations performed when CEC interaction setting changes from an OFF state to an ON state. Here, setting of ON/OFF of the CEC interaction is performed by a user's operation of the user operation unit 324. The setting of the CEC interaction is often called HDMI control setting in ordinary cases.

The CPU 321 turns ON the CEC interaction setting in step ST31, and the process proceeds to step ST32. In step ST32, the CPU 321 determines whether the genre-linked setting of the sound field is in an ON state.

The setting of ON/OFF of the genre-linked of the sound field is performed by a user's operation of the user operation unit 324, as described above. This setting is performed when the HDMI transmitting unit 308 receives setting information from the television receiver 200 through the CEC line on the basis of the setting information. In this point of view, the HDMI transmitting unit 308 constitutes a setting information receiving unit.

When the genre-linked setting of the sound field is in an ON state, the CPU 321 outputs a <System Active Source> message to the CEC line in step ST33. This is because the <Active Source> message is received from an active source device when the CEC interaction setting is in an ON state. When the <Active Source> message is received, it can be expected that the process illustrated in the flowchart in FIG. 15 starts.

That is, if the genre-linked setting of the sound field is in an ON state when the CEC interaction setting is turned ON, the sound field corresponding to the genre information is set at the time. The above-described process of outputting a <System Active Source> message and receiving an <Active Source> message from an active source device is performed in view of the change in genre information of the active source device while the CEC interaction setting is in an OFF state.

After step ST33, the CPU 321 ends the process in step ST35.

If it is determined in step ST32 that the genre-linked setting of the sound field is in an OFF state, the CPU 321 performs nothing in step S34, and ends the process in step ST35. In this case, sound field setting according to genre information is not performed and thus genre information is not obtained.

Figure 19:
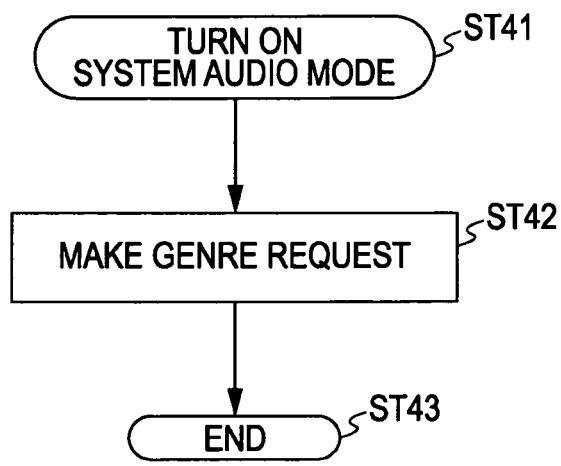
FIG. 19 is a flowchart illustrating an example of operations performed when a system audio mode is changed from an OFF state to an ON state.

The flowchart in FIG. 19 illustrates an example of operations performed when the system audio mode is changed from an OFF state to an ON state.

The CPU 321 turns ON the system audio mode in step ST41, and the process proceeds to step ST42. In step ST42, the CPU 321 makes a genre request (request for genre information). The genre request is made by using a Vendor Specific Command, as described above.

The genre request is made to reproduce the sound field corresponding to the latest genre when the setting is changed from listening on the speaker of the television receiver 200 to listening on the AV amplifier 300.

After step ST42, the CPU 321 ends the process in step ST43.

Figure 20:
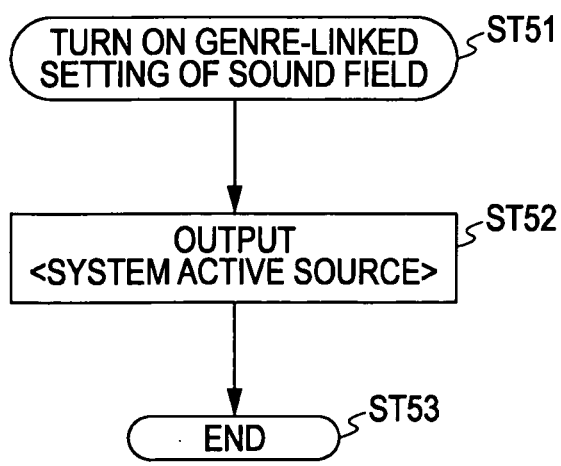
FIG. 20 is a flowchart illustrating an example of operations performed when a genre-linked mode of a sound field is changed from an OFF state to an ON state.

The flowchart in FIG. 20 illustrates an example of operations performed when the genre-linked mode of the sound field is changed from an OFF state to an ON state.

The CPU 321 turns ON the genre-linked mode of the sound field in step ST51, and the process proceeds to step ST52. In step ST52, the CPU 321 outputs a <System Active Source> message to the CEC line. This is because the <Active Source> message is received from an active source device when the genre-linked mode of the sound field is in an ON state.

When the <Active Source> message is received, it can be expected that the process illustrated in the flowchart in FIG. 15 starts.

That is, when the genre-linked mode of the sound field is in turned ON, the sound field corresponding to the genre information is set at that time. The above-described process of outputting a <System Active Source> message and receiving an <Active Source> message from an active source device is performed in view of the change in genre information of the active source device while the genre-linked mode of the sound field is in an OFF state.

After step ST52, the CPU 321 ends the process in step ST53.

When the CPU 321 requests genre information, some time is taken until the request reaches the device in CEC communication. Also, some time is taken for the device received the request to transmit genre information due to the process. Furthermore, when the CPU 321 changes setting of the sound field after receiving the genre information, the CPU 321 sets the setting data again to the DSP 317, which may cause jumpiness.

Therefore, jumpiness may occur after certain time has elapsed from an operation by the user. If the certain time is long, jumpiness may occur after some time from the user's operation. Thus, the CPU 321 performs the process illustrated in the flowchart in FIG. 21 after requesting the genre information.

The CPU 321 requests genre information in step ST61, and the process proceeds to step ST62. In step ST62, the CPU 321 sets a counter to control the output of sound of the AV amplifier 300. Then, the CPU 321 starts muting by controlling the audio amplifying circuit 318 in step ST63.

In step ST64, the CPU 321 determines whether the genre information corresponding to the audio input selected by the selector 316 has been received. If the genre information has not been received, the CPU 321 determines whether certain time has been counted in step ST65. If the certain time has not been counted, the process returns to step ST64.

If it is determined in step ST64 that the genre information has been received or if it is determined in step ST65 that the certain time has been counted, the CPU 321 cancels muting by controlling the audio amplifying circuit 318 in step ST66, and then ends the process in step ST67.

Since the CPU 321 performs the above-described process after requesting the genre information, a muting state continues from a user's operation to setting of the sound field even if time is taken to receive the genre information. Accordingly, the user does not feel unnaturalness caused by jumpiness of sound after certain time from the setting. Furthermore, when the device corresponding to the selected audio input does not have a function to output genre information or when genre information is not returned for certain time, muting is canceled in step ST66, and thus the muting state is not continued.

Next, specific sequence examples in the AV system 100 illustrated in FIG. 1 are described.

Figure 22:
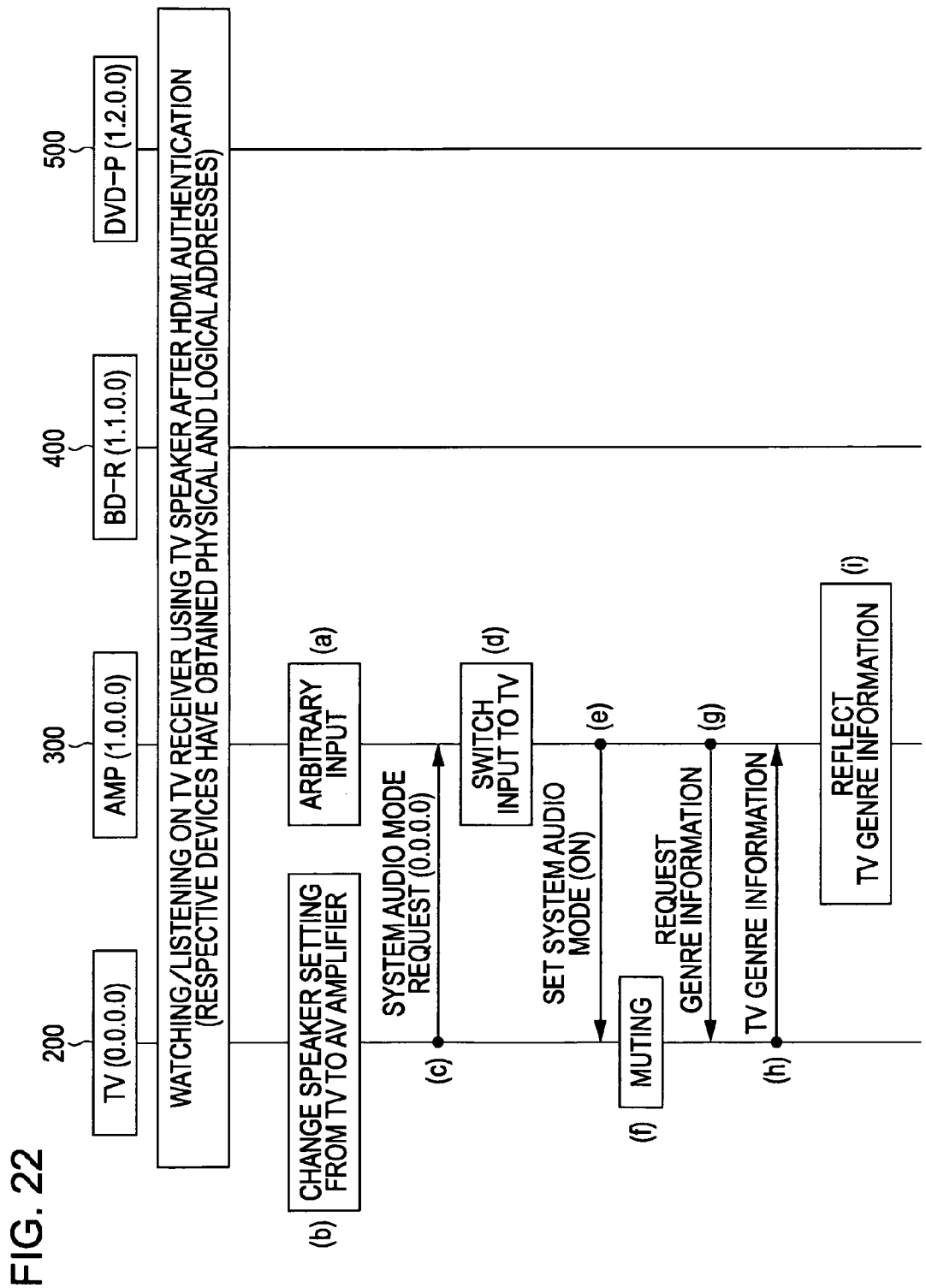
FIG. 22 illustrates an operation sequence of switching to the AV amplifier during watching/listening on the television receiver using its speaker.

(1) FIG. 22 illustrates an operation sequence of switching to the AV amplifier 300 during watching/listening on the television receiver 200 using the speaker 219. Here, assume that the setting of the genre-linked mode is in an ON state in the AV amplifier 300 and that the television receiver 200 is an active source device.

(a) In the state where an arbitrary audio input is selected in the AV amplifier 300, (b) when the speaker setting is changed from television (TV) to the AV amplifier 300 in the television receiver 200, (c) a <Set System Audio mode> message is transmitted from the television receiver 200 to the AV amplifier 300 through the CEC line.

(d) In the AV amplifier 300 that has received the <Set System Audio Mode> message, the audio input is changed to television input. In this case, audio signals supplied from the television receiver 200 through the optical cable 702 are obtained from the selector 316 of the AV amplifier 300.

(e) The AV amplifier 300 notifies the television receiver 200 that the system audio mode has been set to an ON state by using the <Set System Audio Mode> (ON) message. (f) The television receiver 200 that has received the <Set System Audio Mode> (ON) message is brought into a muting state where no sound is output from the speaker 219.

(g) After transmitting the <Set System Audio Mode> message to the television receiver 200, the AV amplifier 300 requests genre information by using a Vendor Specific Command. In this example, the AV amplifier 300 requests genre information only to the television receiver 200 as an active source device among the devices connected in HDMI by unicast.

(h) The television receiver 200 transmits genre information to the AV amplifier 300 in response to the request for genre information from the AV amplifier 300. (i) The AV amplifier 300 sets a sound field on the basis of the genre information obtained from the television receiver 200. That is, in the DSP 317 of the AV amplifier 300, the sound field characteristic corresponding to the genre is given to the television audio signals output from the selector 316.

Figure 23:
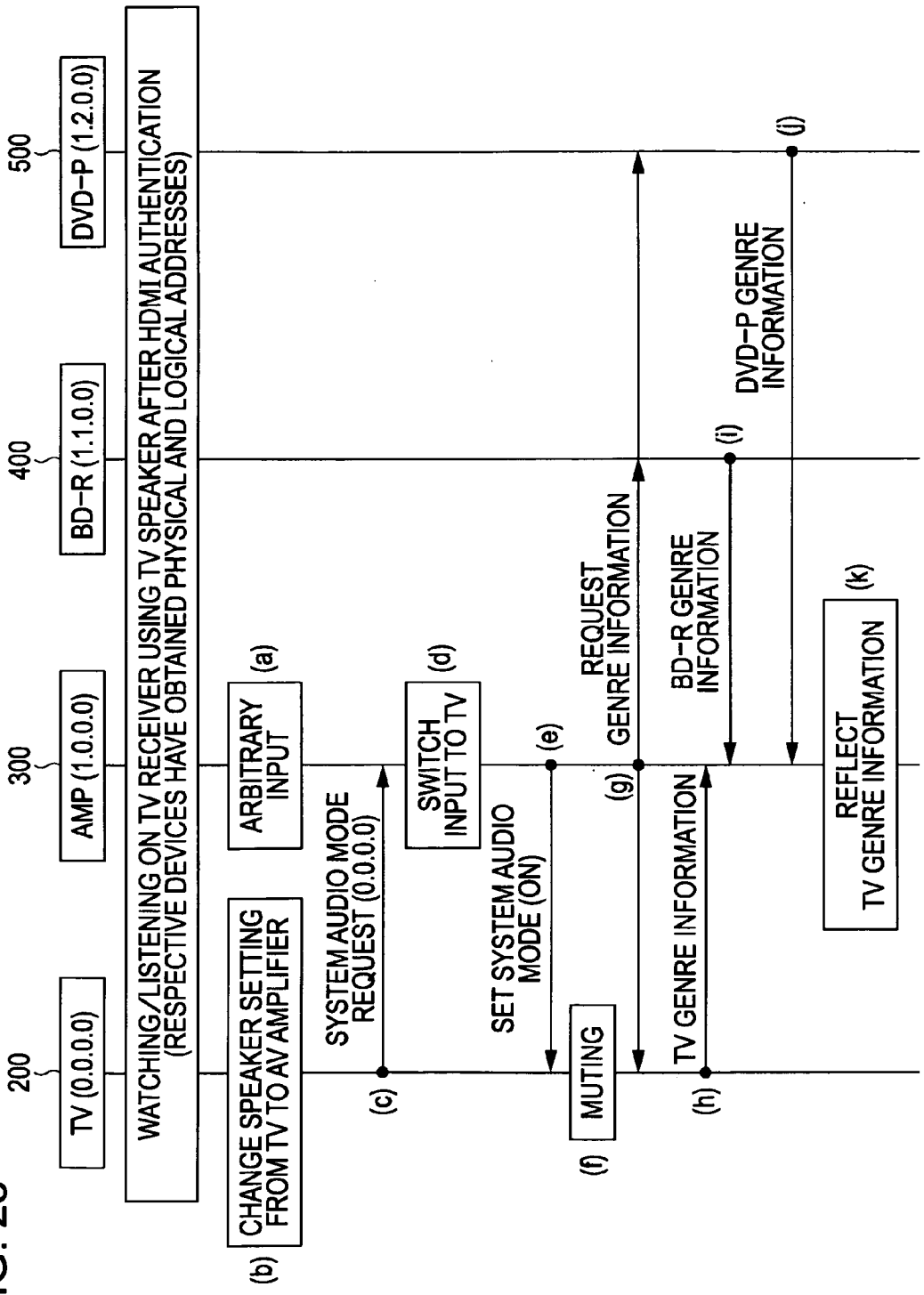
FIG. 23 illustrates an operation sequence of switching to the AV amplifier during watching/listening on the television receiver using its speaker.

(2) FIG. 23 illustrates an operation sequence of switching to the AV amplifier 300 during watching/listening on the television receiver 200 using the speaker 219. Here, assume that the setting of the genre-linked mode is in an ON state in the AV amplifier 300 and that the television receiver 200 is an active source device.

The operations (a) to (f) are the same as those in the operation sequence illustrated in FIG. 22, and thus a detailed description thereof is omitted.

(g) After transmitting the <Set System Audio Mode> message to the television receiver 200, the AV amplifier 300 requests genre information by using a Vendor Specific Command. In this example, the AV amplifier 300 requests genre information to the respective devices connected in HDMI by broadcast.

(h) The television receiver 200 transmits genre information to the AV amplifier 300 in response to the request for genre information from the AV amplifier 300. (i) The BD recorder 400 transmits genre information to the AV amplifier 300 in response to the request for genre information from the AV amplifier 300. (j) The DVD player 500 transmits genre information to the AV amplifier 300 in response to the request for genre information from the AV amplifier 300.

(k) The AV amplifier 300 sets a sound field on the basis of the genre information obtained from the television receiver 200, which is an active source device. That is, in the DSP 317 of the AV amplifier 300, the sound field characteristic corresponding to the genre indicated by the genre information from the television receiver 200 is given to the television audio signals output from the selector 316.

Figure 24:
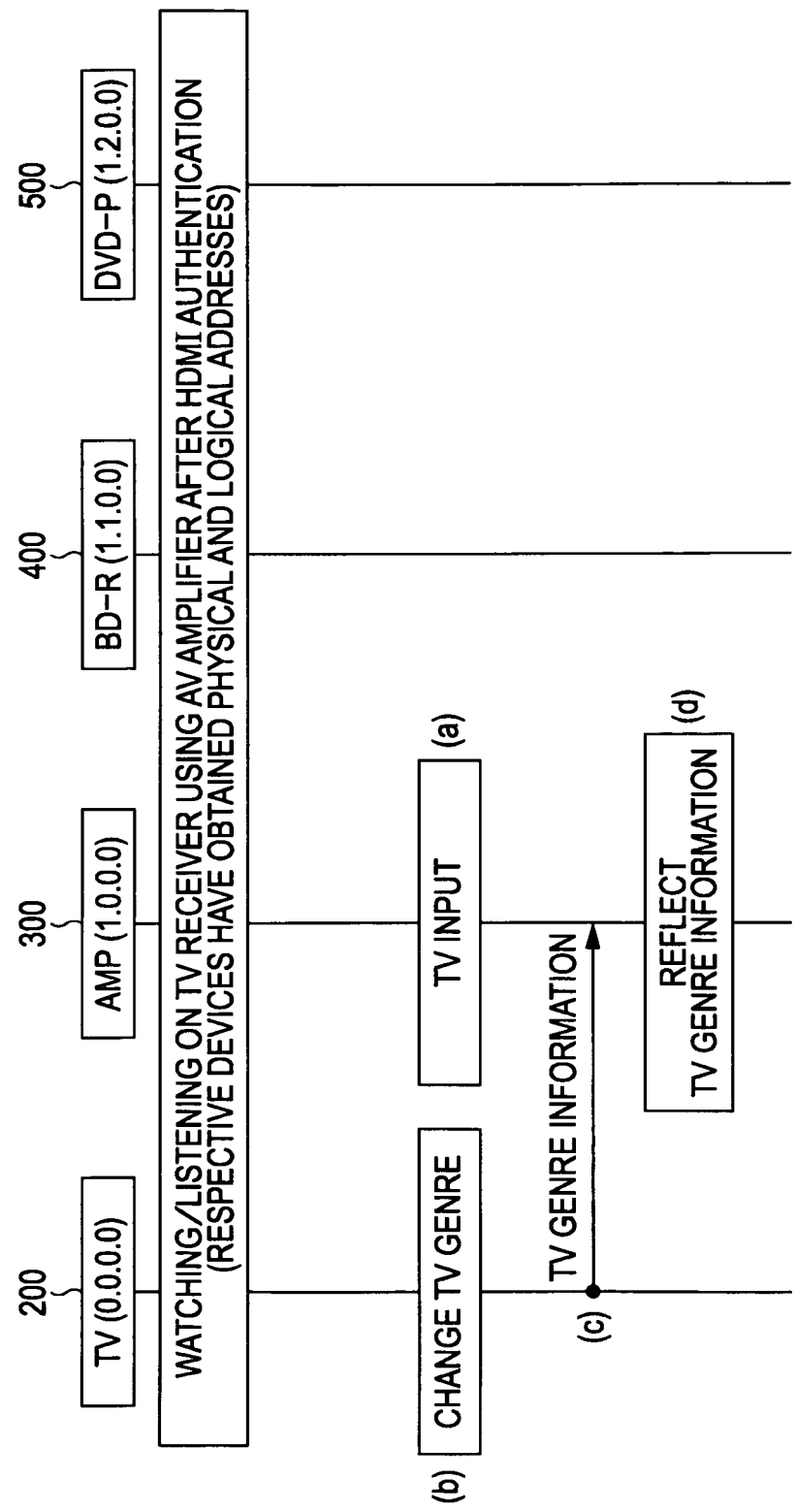
FIG. 24 illustrates an operation sequence performed when a genre of TV changes during watching/listening on the television receiver using the AV amplifier.

(3) FIG. 24 illustrates an operation sequence performed when a TV genre changes during watching/listening on the television receiver 200 using the AV amplifier 300. Here, assume that the setting of the genre-linked mode is in an ON state in the AV amplifier 300 and that the television receiver 200 is an active source device.

(a) In the state where a TV input is selected in the AV amplifier 300, (b) a genre is changed in accordance with a change of program in the same channel or a change of program due to switching of channels. (c) The television receiver 200 transmits genre information to the AV amplifier 300 through the CEC line. (d) The AV amplifier 300 sets a sound field on the basis of the genre information obtained from the television receiver 200. That is, in the DSP 317 of the AV amplifier 300, the sound field characteristic corresponding to the genre is given to the television audio signals output from the selector 316.

Figure 25:
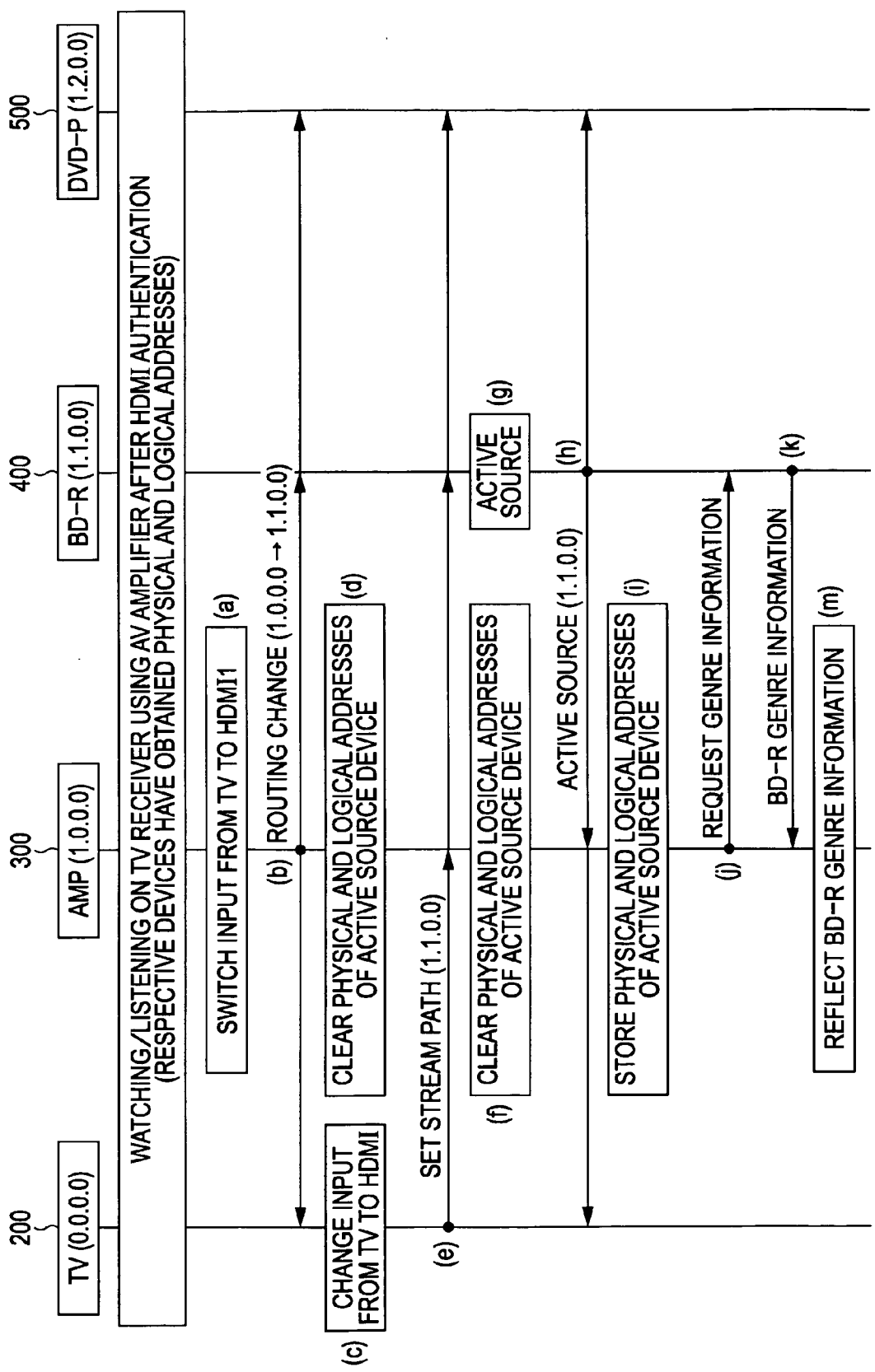
FIG. 25 illustrates an operation sequence performed when input of the AV amplifier is switched from TV to HDMI1 (BD recorder) during watching/listening on TV using the AV amplifier.

(4) FIG. 25 illustrates an operation sequence performed when the input of the AV amplifier 300 is switched from TV to HDMI1 (BD recorder) during watching/listening on TV using the AV amplifier 300. Here, assume that the setting of the genre-linked mode is in an ON state in the AV amplifier 300 and that the active source device is the television receiver 200 in an initial state.

(a) In the AV amplifier 300, audio input is switched from TV to HDMI1 (BD recorder). In this case, in the AV amplifier 300, the HDMI terminal 301 connected to the BD recorder 400 is connected to the HDMI receiving unit 307 by the HDMI switcher 306. Accordingly, video and audio data from the BD recorder 400 is transmitted to the television receiver 200 connected to the HDMI terminal 304 from the HDMI terminal 301 via the HDMI switcher 306, the HDMI receiving unit 307, the HDMI transmitting unit 308, and the HDMI terminal 304. Also, in the selector 316, audio data from the BD recorder 400 obtained by the HDMI receiving unit 307 is extracted.

(b) When audio input is switched from TV to HDMI1 (BD recorder) as described above, the AV amplifier 300 outputs a <Routing Change> [1000]→[1100] message indicating the switching of audio input to the CEC line so as to notify the respective devices.

(c) The television receiver 200 that has received the <Routing Change> [1000][1100] message changes the input from TV to HDMI. That is, in the television receiver 200, images based on the video data received by the HDMI receiving unit 205 are displayed on the display panel 216. (d) Also, the AV amplifier 300 clears the logical and physical addresses of the source of the <Active Source> message (active source device) stored in the DRAM 323.

(e) After changing the input from TV to HDMI as described above, the television receiver 200 outputs a <Set Stream Path> [1100] message to the CEC line so as to notify the respective devices that the input has been changed from the TV to the BD recorder 400. (f) The AV amplifier 300 that has received the <Set Stream Path> [1100] message clears the logical and physical addresses of the source of the <Active Source> message (active source device) stored in the DRAM 323.

(g) The BD recorder 400 that has received the <Set Stream Path> [1100] message becomes an active source device. (h) Then, the BD recorder 400 outputs an <Active Source> [1100] message to the CEC line so as to notify the respective device that the BD recorder 400 is an active source device. (i) In accordance with reception of the <Active Source> [1100] message, the AV amplifier 300 stores the logical and physical addresses of the source (BD recorder 400) in the DRAM 323.

(j) After storing the logical and physical addresses of the source (BD recorder 400) in the DRAM 323, the AV amplifier 300 requests genre information by using a Vendor Specific Command. In this example, the AV amplifier 300 requests genre information only to the BD recorder 400 as an active source device among the respective HDMI-connected devices by unicast.

(k) The BD recorder 400 transmits genre information to the AV amplifier 300 in response to the request for genre information from the AV amplifier 300. (m) The AV amplifier 300 sets a sound field on the basis of the genre information obtained from the BD recorder 400. That is, in the DSP 317 of the AV amplifier 300, the sound field characteristic corresponding to the genre is given to the audio signals from the BD recorder 400 output from the selector 316.

Figure 26:
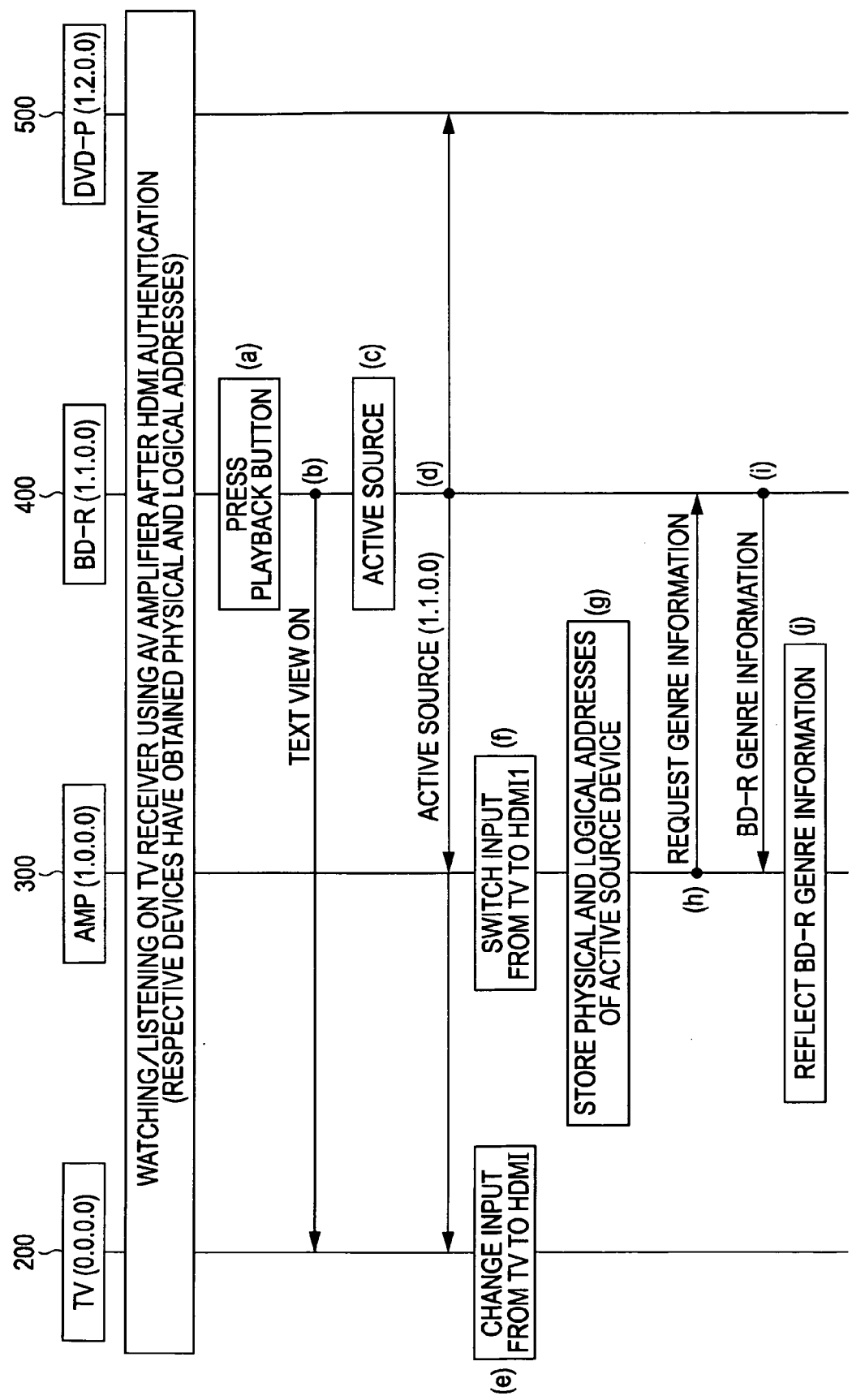
FIG. 26 illustrates an operation sequence performed when playback in the BD recorder starts during watching/listening on the television receiver using the AV amplifier.

(5) FIG. 26 illustrates an operation sequence performed when playback in the BD recorder 400 is started during watching/listening on the television receiver 200 using the AV amplifier 300. Here, assume that the setting of the genre-linked mode is in an ON state in the AV amplifier 300 and that the active source device is the television receiver 200 in an initial state.

(a) When a playback button of the BD recorder 400 is pressed by the user, (b) the BD recorder 400 transmits a <Text View On> message as a request for screen output to the television receiver 200. (c) The BD recorder 400 becomes an active source device, and (d) outputs an <Active Source> [1100] message to the CEC line so as to notify the respective devices that the BD recorder 400 is an active source device.

(e) The television receiver 200 that has received the <Active Source> [1100] message changes the input from TV to HDMI. That is, in the television receiver 200, images based on the video data received by the HDMI receiving unit 205 are displayed on the display panel 216.

(f) The AV amplifier 300 that has received the <Active Source> [1100] message switches audio input from TV to HDMI1 (BD recorder). In this case, in the AV amplifier 300, the HDMI terminal 301 connected to the BD recorder 400 is connected to the HDMI receiving unit 307 by the HDMI switcher 306.

Accordingly, video and audio data from the BD recorder 400 is transmitted from the HDMI terminal 301 to the television receiver 200 connected to the HDMI terminal 304 via the HDMI switcher 306, the HDMI receiving unit 307, the HDMI transmitting unit 308, and the HDMI terminal 304. Also, the audio data from the BD recorder 400 obtained by the HDMI receiving unit 307 is extracted by the selector 316.

(g) Also, the AV amplifier 300 stores the logical and physical addresses of the source of the <Active Source> [1100] message (BD recorder 400) in the DRAM 323 after receiving the message. (h) Then, the AV amplifier 300 requests genre information by using a Vendor Specific Command. In this example, the AV amplifier 300 requests genre information only to the BD recorder 400 as an active source device among the HDMI-connected devices by unicast.

(i) The BD recorder 400 transmits genre information to the AV amplifier 300 in response to the request for genre information from the AV amplifier 300. (j) The AV amplifier 300 sets a sound field on the basis of the genre information obtained from the BD recorder 400. That is, in the DSP 317 of the AV amplifier 300, the sound field characteristic corresponding to the genre is given to the audio signals from the BD recorder 400 output from the selector 316.

Figure 27:
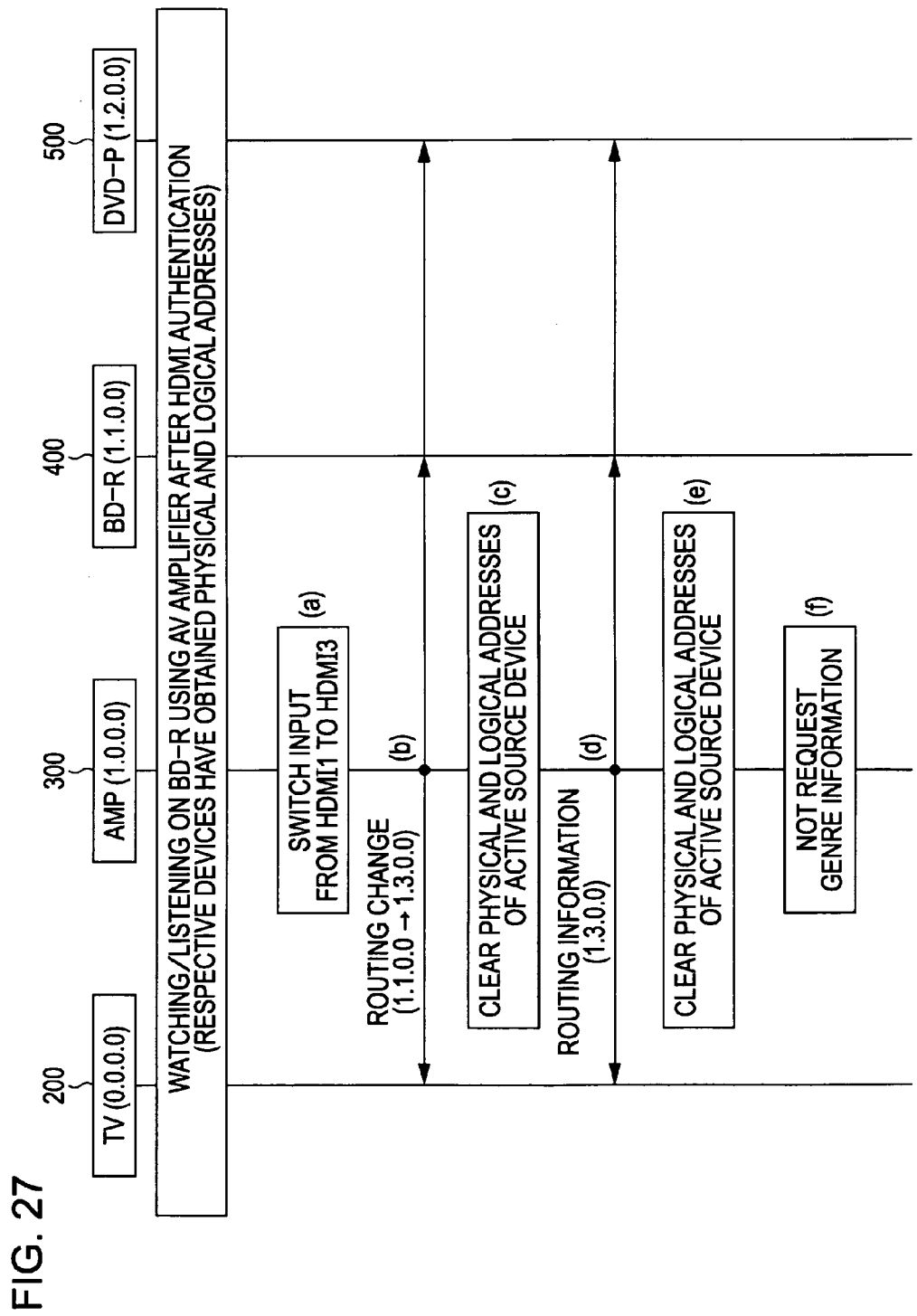
FIG. 27 illustrates an operation sequence performed when input of the AV amplifier is switched from HDMI1 (BD recorder) to HDMI3 (DVD recorder) during watching/listening on the BD recorder using the AV amplifier.

(6) FIG. 27 illustrates an operation sequence performed when the input of the AV amplifier 300 is switched from HDMI1 (BD recorder) to HDMI3 (DVD recorder) during watching/listening on BD recorder 400 using the AV amplifier 300. Here, assume that the setting of the genre-linked mode is in an ON state in the AV amplifier 300 and that the active source device is the BD recorder 400 in an initial state.

(a) In the AV amplifier 300, audio input is switched from HDMI1 (BD recorder) to HDMI3 (DVD recorder). In this case, in the AV amplifier 300, the HDMI terminal 303 connected to the DVD recorder 600 is connected to the HDMI receiving unit 307 by the HDMI switcher 306. Accordingly, video and audio data from the DVD recorder 600 is transmitted from the HDMI terminal 303 to the television receiver 200 connected to the HDMI terminal 304 via the HDMI switcher 306, the HDMI receiving unit 307, the HDMI transmitting unit 308, and the HDMI terminal 304. Also, in the selector 316, audio data from the DVD recorder 600 obtained by the HDMI receiving unit 307 is extracted.

(b) When audio input is switched from HDMI1 (BD recorder) to HDMI3 (DVD recorder) as described above, the AV amplifier 300 outputs a <Routing Change> [1100]→[1300] message indicating the switching of audio input to the CEC line so as to notify the respective devices.

(c) Also, the AV amplifier 300 clears the logical and physical addresses of the source of the <Active Source> message (active source device) stored in the DRAM 323. (d) Furthermore, the AV amplifier 300 notifies the respective devices of the change of input by outputting a <Routing Information> [1300] message to the CEC line.

(e) The AV amplifier 300 clears the logical and physical addresses of the source of the <Active Source> message (active source device) stored in the DRAM 323. (f) Since the DVD recorder 600 is incompatible with CEC, the AV amplifier 300 does not request genre information to the DVD recorder 600.

When audio input is switched from HDMI1 (BD recorder) to HDMI3 (DVD recorder) in the AV amplifier 300 in the above-described manner, the audio signals from the DVD recorder 600 output from the selector 316 are not processed in the DSP 317.

Figure 28:
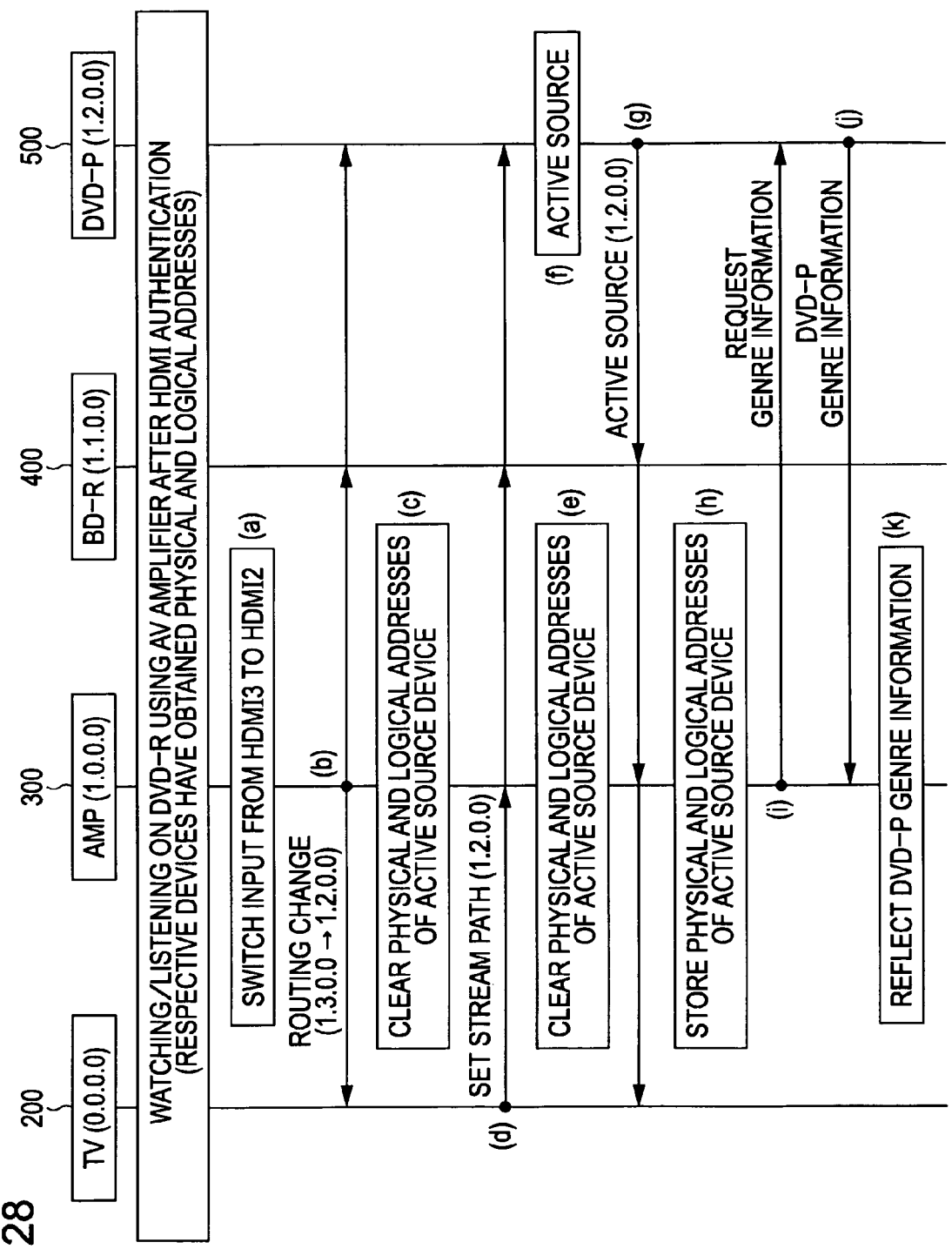
FIG. 28 illustrates an operation sequence performed when input of the AV amplifier is switched from HDMI3 (DVD recorder) to HDMI2 (DVD player) during watching/listening on the DVD recorder using the AV amplifier.

(7) FIG. 28 illustrates an operation sequence performed when the input of the AV amplifier 300 is switched from HDMI3 (DVD recorder) to HDMI2 (DVD player) during watching/listening on the DVD recorder 600 using the AV amplifier 300. Here, assume that the setting of the genre-linked mode is in an ON state in the AV amplifier 300 and that the active source device is the DVD recorder 600 in an initial state.

(a) In the AV amplifier 300, audio input is switched from HDMI3 (DVD recorder) to HDMI2 (DVD player). In this case, in the AV amplifier 300, the HDMI terminal 302 connected to the DVD player 500 is connected to the HDMI receiving unit 307 by the HDMI switcher 306. Accordingly, video and audio data from the DVD player 500 is transmitted from the HDMI terminal 302 to the television receiver 200 connected to the HDMI terminal 304 via the HDMI switcher 306, the HDMI receiving unit 307, the HDMI transmitting unit 308, and the HDMI terminal 304. Also, in the selector 316, audio data from the DVD player 500 obtained by the HDMI receiving unit 307 is extracted.

(b) When audio input is switched from HDMI3 (DVD recorder) to HDMI2 (DVD player) as described above, the AV amplifier 300 outputs a <Routing Change> [1300]→[1200] message indicating the switching of audio input to the CEC line so as to notify the respective devices. (c) Then, the AV amplifier 300 clears the logical and physical addresses of the source of the <Active Source> message (active source device) stored in the DRAM 323.

(d) After receiving the <Routing Change> [1300]→[1200] message, the television receiver 200 outputs a <Set Stream Path> [1200] message to the CEC line so as to notify the respective devices that the input has been changed from the DVD recorder 600 to the DVD player 500. (e) The AV amplifier 300 that has received the <Set Stream Path> [1200] message clears the logical and physical addresses of the source of the <Active Source> message (active source device) stored in the DRAM 323.

(f) The DVD player 500 that has received the <Set Stream Path> [1200] message becomes an active source device. (g) Then, the DVD player 500 outputs an <Active Source> [1200] message to the CEC line so as to notify the respective devices that the DVD player 500 is an active source device. (h) In accordance with the reception of the <Active Source> [1200] message, the AV amplifier 300 stores the logical and physical addresses of the source (DVD player 500) in the DRAM 323.

(i) After storing the logical and physical addresses of the source (DVD player 500) in the DRAM 323, the AV amplifier 300 requests genre information by using a Vendor Specific Command. In this example, the AV amplifier 300 requests genre information only to the DVD player 500 as an active source device among the HDMI-connected devices by unicast.

(j) The DVD player 500 transmits genre information to the AV amplifier 300 in response to the request for genre information from the AV amplifier 300. (k) The AV amplifier 300 sets a sound field on the basis of the genre information obtained from the DVD player 500. That is, in the DSP 317 of the AV amplifier 300, the sound field characteristic corresponding to the genre is given to the audio signals from the DVD player 500 output from the selector 316.

(8) FIG. 29 illustrates an operation sequence performed when the input of the AV amplifier 300 is switched from TV to FM during watching/listening on the TV receiver 200 using the AV amplifier 300. Here, assume that the setting of the genre-linked mode is in an ON state in the AV amplifier 300 and that the active source device is the television receiver 200.

(a) In the AV amplifier 300, audio input is switched from TV to FM. In this case, in the AV amplifier 300, FM audio signals from the FM tuner 313 are extracted by the selector 316 by the selectors 314 and 316. (b) Since the audio input is not from a CEC-compatible device, the AV amplifier 300 does not request genre information.

When audio input is switched from TV to FM in the AV amplifier 300 in the above-described manner, the FM audio signals output from the selector 316 are not processed in the DSP 317.

(9) FIG. 30 illustrates an operation sequence performed when the input of the AV amplifier 300 is switched from TV to FM during watching/listening on the TV receiver 200 using the AV amplifier 300. This operation sequence is an example of turning OFF the system audio mode in accordance with switching. Here, assume that the setting of the genre-linked mode is in an ON state in the AV amplifier 300 and that the active source device is the television receiver 200.

(a) In the AV amplifier 300, audio input is switched from TV to FM. In this case, in the AV amplifier 300, FM audio signals from the FM tuner 313 are extracted by the selector 316 by the selectors 314 and 316. (b) Then, the AV amplifier 300 transmits a <Set System Audio Mode> (OFF) message to the television receiver 200 through the CEC line so as to notify the television receiver 200 that the system audio mode will be turned OFF.

(c) The television receiver 200 that has received the <Set System Audio Mode> (OFF) message changes the speaker setting from the AV amplifier 300 to TV. (d) The AV amplifier 300 turns OFF the system audio mode after transmitting the <Set System Audio Mode> (OFF) message.

(10) FIG. 31 illustrates an operation sequence performed when the genre-linked mode is changed from an OFF state to an ON state during watching/listening on the TV receiver 200 using the AV amplifier 300. Here, assume that the setting of the genre-linked mode is in an OFF state in the AV amplifier 300 in an initial state and that the active source device is the television receiver 200.

(a) When the genre-linked mode is changed from an OFF state to an ON state, (b) the AV amplifier 300 requests genre information by using a Vendor Specific Command. In this example, the AV amplifier 300 requests genre information only to the television receiver 200 as an active source device by unicast.

(c) The television receiver 200 transmits genre information to the AV amplifier 300 in response to the request for genre information from the AV amplifier 300. (d) The AV amplifier 300 sets a sound field on the basis of the genre information obtained from the television receiver 200 as an active source device. That is, in the DSP 317 of the AV amplifier 300, the sound field characteristic corresponding to the genre indicated by the genre information from the television receiver 200 is given to the TV audio signals output from the selector 316.

(11) FIG. 32 illustrates an operation sequence performed when the genre-linked mode is changed from an OFF state to an ON state during watching/listening on the TV receiver 200 using the AV amplifier 300. This operation sequence is an example of the case where the AV amplifier 300 does not recognize an active source device. Here, assume that the setting of the genre-linked mode is in an OFF state in the AV amplifier 300 in an initial state and that the active source device is the television receiver 200.

(a) In the AV amplifier 300, the genre-linked mode is changed from an OFF state to an ON state. (b) The AV amplifier 300 outputs a <Request Active Source> message to the CEC line so as to request transmission of an <Active Source> message from the active source device.

(c) The television receiver 200, which is an active source device, outputs an <Active Source> [0000] message to the CEC line so as to notify the other devices that the television receiver 200 is an active source device.

(d) The AV amplifier 300 that has received the <Active Source> [0000] message requests genre information by using a Vendor Specific Command. In this example, the AV amplifier 300 requests genre information only to the television receiver 200 as an active source device by unicast.

(e) The television receiver 200 transmits genre information to the AV amplifier 300 in response to the request for genre information from the AV amplifier 300. (f) The AV amplifier 300 sets a sound field on the basis of the genre information obtained from the television receiver 200 as an active source device. That is, in the DSP 317 of the AV amplifier 300, the sound field characteristic corresponding to the genre indicated by the genre information from the television receiver 200 is given to the TV audio signals output from the selector 316.

(12) FIG. 33 illustrates an operation sequence performed when the BD recorder 400 is selected from the TV receiver 200 during watching/listening on the television receiver 200 using the AV amplifier 300. Here, assume that the setting of the genre-linked mode is in an ON state in the AV amplifier 300 and that the active source device is the television receiver 200 in an initial state.

(a) When the BD recorder 400 is selected from a menu, (b) the television receiver 200 changes the input from TV to HDMI. That is, in the television receiver 200, images based on video data received by the HDMI receiving unit 205 are displayed on the display panel 216.

(c) Then, the television receiver 200 outputs a <Set Stream Path> [1100] message to the CEC line so as to notify the respective devices that the input has been changed from the TV to the BD recorder 400. (d) In the AV amplifier 300 that has received the <Set Stream Path> [1100] message, audio input is switched from TV to HDMI1 (BD recorder).

In this case, in the AV amplifier 300, the HDMI terminal 301 connected to the BD recorder 400 is connected to the HDMI receiving unit 307 by the HDMI switcher 306. Accordingly, video and audio data from the BD recorder 400 is transmitted from the HDMI terminal 301 to the television receiver 200 connected to the HDMI terminal 304 via the HDMI switcher 306, the HDMI receiving unit 307, the HDMI transmitting unit 308, and the HDMI terminal 304. Also, in the selector 316, audio data from the BD recorder 400 obtained by the HDMI receiving unit 307 is extracted.

(e) The AV amplifier 300 that has received the <Set Stream Path> [1100] message clears the logical and physical addresses of the source of the <Active Source> message (active source device) stored in the DRAM 323.

(f) The BD recorder 400 that has received the <Set Stream Path> [1100] message becomes an active source device. (g) Then, the BD recorder 400 outputs an <Active Source> [1100] message to the CEC line so as to notify the respective devices that the BD recorder 400 is an active source device.

(h) In accordance with reception of the <Active Source> [1100] message, the AV amplifier 300 stores the logical and physical addresses of the source (BD recorder 400) in the DRAM 323.

(i) After storing the logical and physical addresses of the source (BD recorder 400) in the DRAM 323, the AV amplifier 300 requests genre information by using a Vendor Specific Command. In this example, the AV amplifier 300 requests genre information only to the BD recorder 400 as an active source device among the HDMI-connected devices by unicast.

(j) The BD recorder 400 transmits genre information to the AV amplifier 300 in response to the request for genre information from the AV amplifier 300. (k) The AV amplifier 300 sets a sound field on the basis of the genre information obtained from the BD recorder 400. That is, in the DSP 317 of the AV amplifier 300, the sound field characteristic corresponding to the genre is given to the audio signals from the BD recorder 400 output from the selector 316.

As described above, in the AV amplifier 300 of the AV system 100 illustrated in FIG. 1, a sound field characteristic based on received genre information is basically given in the DSP 317 when the system audio mode is in an ON state and when the genre-linked mode of the sound field is in an ON state. In this case, however, a sound field characteristic based on genre information is not given if the logical address of the source of the genre information does not match the logical address of the source of the <Active Source> message stored in the DRAM 323 (see step ST12 in FIG. 16). Accordingly, it can be prevented that an inappropriate sound field is set due to genre information from a device that is not an active source device.

In the AV amplifier 300 of the AV system 100 illustrated in FIG. 1, even when the logical address of the source of genre information matches the logical address of the source of the <Active Source> message stored in the DRAM 323, if the current audio input does not match the audio input assigned to the physical address of the source of the <Active Source> message, a sound field characteristic based on the genre information is not given (see step ST13 in FIG. 16). Thus, in the case where the current audio input is from a CEC-incompatible device (DVD recorder 600) or a built-in FM tuner and where the audio input without transmission of genre information is selected, it can be prevented that an inappropriate sound field characteristic based on genre information unrelated to audio signals is given to the audio signals corresponding to the audio input.

In the AV amplifier 300 of the AV system 100 illustrated in FIG. 1, genre information is requested to an active source device when an <Active Source> message is transmitted through the CEC line (see step ST4 in FIG. 15). Thus, genre information can be quickly obtained from the active source device, and a sound field characteristic can be favorably given to audio signals on the basis of the genre information.

In the AV amplifier 300 of the AV system 100 illustrated in FIG. 1, genre information is requested to a device that outputs audio signals corresponding to a changed audio input when the audio input changes (see (d) and (g) in FIG. 22). Thus, genre information can be quickly obtained from the device that outputs audio signals corresponding to the selected audio input, and a sound field characteristic can be favorably given to the audio signals on the basis of the genre information.

Figure 21:
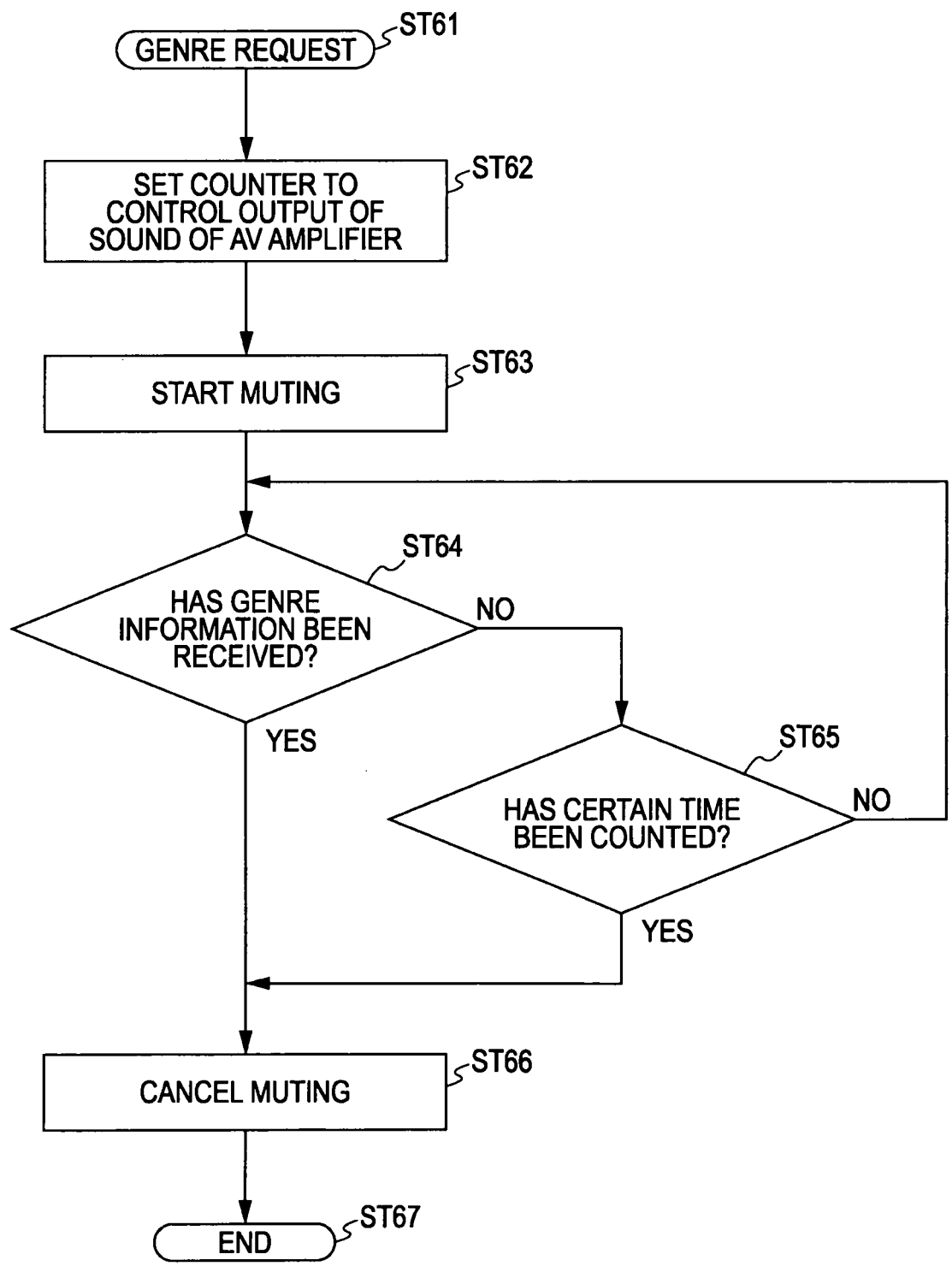
FIG. 21 is a flowchart illustrating an example of operations performed after genre information is requested.

In the AV amplifier 300 of the AV system 100 illustrated in FIG. 1, muting is started when genre information is requested and is canceled when genre information corresponding to audio input is received (see FIG. 21). Accordingly, the muting state continues from a user's operation to setting of a sound field, so that the user does not feel unnaturalness caused by jumpiness of sound after certain time from the user setting.

In this case, muting is canceled if genre information is not received within predetermined time. Therefore, continuation of the muting state can be prevented in the case where the device corresponding to a selected audio input does not have a function of transmitting genre information.

In the above-described embodiments, no device connects to the HDMI terminal 202 of the television receiver 200. Alternatively, an AV system 100A including a device connected to the HDMI terminal 202 can be applied.

In the AV system 100A, a DVD player 800 as a CEC-compatible device connects to the HDMI terminal 202 of the television receiver 200 through an HDMI cable 706. That is, one end of the HDMI cable 706 connects to the HDMI terminal 202 of the television receiver 200, and the other end thereof connects to an HDMI terminal 801 of the DVD player 800. In this case, the DVD player 800 has a physical address [1200] and has a logical address {8} because the DVD player 800 is a playback device (see FIG. 2).

The above-described AV amplifier 300 of the AV system 100 can be applied to the AV amplifier 300 of the AV system 100A illustrated in FIG. 34, and the same operation and effect can be obtained.

It should be understood by those skilled in the art that various modifications, combinations, sub-combinations and alterations may occur depending on design requirements and other factors insofar as they are within the scope of the appended claims or the equivalents thereof.

What is claimed is:

1. An audio processing device comprising:
    an audio input selecting unit configured to select a predetermined audio input from among a plurality of audio inputs;
    a signal processing unit configured to give a predetermined sound field characteristic to audio signals of the audio input selected by the audio input selecting unit;
    a signal output unit configured to output the audio signals obtained in the signal processing unit;
    a genre information receiving unit configured to receive genre information transmitted from any of audio signal output devices;
    a sound field control unit configured to control the signal processing unit to give a sound field characteristic corresponding to the genre information if the genre information received by the genre information receiving unit is determined to be the genre information corresponding to the audio input selected by the audio input selecting unit; and
    a genre information requesting unit configured to request genre information to any of the audio signal output devices,
    wherein an output of the signal output unit is controlled in accordance with a request for the genre information by the genre information requesting unit.

2. The audio processing device according to claim 1, further comprising:
    HDMI terminals connected to the audio signal output devices to output audio signals corresponding to the plurality of audio inputs,
    wherein the genre information receiving unit receives genre information from any of the audio signal output devices through a CEC line, and
    wherein the sound field control unit determines that the genre information received by the genre information receiving unit is the genre information corresponding to the audio input selected by the audio input selecting unit when a source of the genre information received by the genre information receiving unit is the audio signal output device of an active source.

3. The audio processing device according to claim 2,
wherein the sound field control unit receives an active source message from the audio signal output device of the active source among the audio signal output devices through the CEC line and stores a logical address of the source of the active source message, and
wherein, if a logical address of the source of the genre information received by the genre information receiving unit matches the stored logical address, the sound field control unit determines that the genre information received by the genre information receiving unit is the genre information corresponding to the audio input selected by the audio input selecting unit.

4. The audio processing device according to claim 1, further comprising:
HDMI terminals connected to the audio signal output devices to output audio signals corresponding to at least part of the plurality of audio inputs,
wherein the genre information receiving unit receives genre information from any of the audio signal output devices through a CEC line, and
wherein the sound field control unit determines that the genre information received by the genre information receiving unit is the genre information corresponding to the audio input selected by the audio input selecting unit when a source of the genre information received by the genre information receiving unit is the audio signal output device to output audio signals corresponding to the audio input selected by the audio input selecting unit.

5. The audio processing device according to claim 1,
wherein the sound field control unit receives an active source message from the audio signal output device of an active source among the audio signal output devices through a CEC line and stores a logical address and a physical address of the source of the active source message, and
wherein, if a logical address of the source of the genre information received by the genre information receiving unit matches the stored logical address and if the audio input selected by the audio input selecting unit matches the audio input corresponding to the stored physical address, the sound field control unit determines that the genre information received by the genre information receiving unit is the genre information corresponding to the audio input selected by the audio input selecting unit.

6. The audio processing device according to claim 1, further comprising:
HDMI terminals connected to the audio signal output devices to output audio signals corresponding to at least part of the plurality of audio inputs,
wherein the genre information requesting unit requests genre information to any of the audio signal output devices through a CEC line.

7. The audio processing device according to claim 6,
wherein the genre information requesting unit requests genre information to any of the audio signal output devices through the CEC line when an active source message is transmitted through the CEC line.

8. The audio processing device according to claim 6,
wherein the genre information requesting unit requests genre information to the audio signal output device of an active source.

9. The audio processing device according to claim 6,
wherein the genre information requesting unit requests genre information by broadcast.

10. The audio processing device according to claim 1,
wherein the genre information requesting unit requests genre information to the audio signal output device to output audio signals corresponding to a changed audio input when the audio input selected by the audio input selecting unit is changed.

11. The audio processing device according to claim 1, further comprising:
a mode setting unit configured to set a genre-linked mode to give a sound field characteristic to output audio signals on the basis of genre information,
wherein the genre information requesting unit requests genre information to any of the audio signal output devices when the genre-linked mode is set by the mode setting unit.

12. The audio processing device according to claim 1, further comprising:
a set information receiving unit configured to receive set information of a genre-linked mode to give a sound field characteristic to output audio signals on the basis of genre information,
wherein the genre information requesting unit requests genre information to any of the audio signal output devices when the genre-linked mode is set on the basis of the set information received by the set information receiving unit.

13. The audio processing device according to claim 1, further comprising:
a mode setting unit configured to set a system audio mode to output audio signals output from any of the audio signal output devices from the signal output unit,
wherein the genre information requesting unit requests genre information to the audio signal output device when the system audio mode is set by the mode setting unit.

14. The audio processing device according to claim 1, further comprising:
a set information receiving unit configured to receive set information to set a system audio mode to output audio signals output from any of the audio signal output devices from the signal output unit,
wherein the genre information requesting unit requests genre information to the audio signal output device when the system audio mode is set on the basis of the set information received by the set information receiving unit.

15. The audio processing device according to claim 1, wherein the output of the signal output unit is controlled in accordance with the request for the genre information by the genre information requesting unit such that muting is started when the genre information is requested.

16. The audio processing device according to claim 15, wherein the muting is canceled when the genre information receiving unit receives the genre information corresponding to the audio input selected by the audio input selecting unit.

17. An audio processing device comprising:
an audio input selecting unit configured to select a predetermined audio input from among a plurality of audio inputs;
a signal processing unit configured to give a predetermined sound field characteristic to audio signals of the audio input selected by the audio input selecting unit;
a signal output unit configured to output the audio signals obtained in the signal processing unit;

a genre information receiving unit configured to receive genre information transmitted from any of audio signal output devices;

a sound field control unit configured to control the signal processing unit to give a sound field characteristic corresponding to the genre information if the genre information received by the genre information receiving unit is determined to be the genre information corresponding to the audio input selected by the audio input selecting unit;

a genre information requesting unit configured to request genre information to any of the audio signal output devices; and an output control unit configured to control the signal output unit to start muting when the genre information requesting unit requests genre information and cancel the muting when the genre information receiving unit receives the genre information corresponding to the audio input selected by the audio input selecting unit.

18. The audio processing device according to claim 17, wherein the output control unit cancels the muting if the genre information receiving unit does not receive the genre information corresponding to the audio input selected by the audio input selecting unit within certain time.

19. An audio processing method comprising the steps of:
selecting a predetermined audio input from among a plurality of audio inputs;
giving a predetermined sound field characteristic to audio signals of the audio input selected in the selecting;
outputting the audio signals obtained in the giving;
receiving genre information transmitted from any of audio signal output devices; and
controlling to give a sound field characteristic corresponding to the genre information in the giving if the genre information received in the receiving is determined to be the genre information corresponding to the audio input selected in the selecting;
and further comprising the steps of:
requesting genre information to any of the audio signal output devices; and
controlling the outputting step to start muting when the genre information is requested in the requesting step and cancel the muting when the genre information is received in the receiving step which corresponds to the selected audio input.

20. A non-transitory computer readable memory having stored thereon a program allowing a computer to function as:
audio input selecting means for selecting a predetermined audio input from among a plurality of audio inputs;
signal processing means for giving a predetermined sound field characteristic to audio signals of the audio input selected by the audio input selecting means;
signal output means for outputting the audio signals obtained in the signal processing means;
genre information receiving means for receiving genre information transmitted from any of audio signal output devices;
sound field control means for controlling the signal processing means to give a sound field characteristic corresponding to the genre information if the genre information received by the genre information receiving means is determined to be the genre information corresponding to the audio input selected by the audio input selecting means;
genre information requesting means for requesting genre information to any of the audio signal output devices; and
output control means for controlling the signal output unit to start muting when the genre information requesting means requests genre information and cancel the muting when the genre information receiving means receives the genre information corresponding to the audio input selected by the audio input selecting means.

* * * * *